United States Patent
Oishi et al.

(10) Patent No.: US 11,932,729 B2
(45) Date of Patent: Mar. 19, 2024

(54) POLYBENZIMIDAZOLE, PRECURSOR POLYAMIDE THEREOF, AND METHOD FOR PRODUCING SAME

(71) Applicants: DAIKIN INDUSTRIES, LTD., Osaka (JP); NATIONAL UNIVERSITY CORPORATION, IWATE UNIVERSITY, Morioka (JP)

(72) Inventors: Yoshiyuki Oishi, Morioka (JP); Tsuyoshi Noguchi, Osaka (JP); Tadashi Kanbara, Osaka (JP)

(73) Assignees: DAIKIN INDUSTRIES, LTD., Osaka (JP); NATIONAL UNIVERSITY CORPORATION, IWATE UNIVERSITY, Morioka (JP)

( * ) Notice: Subject to any disclaimer, the term of this patent is extended or adjusted under 35 U.S.C. 154(b) by 0 days.

(21) Appl. No.: 18/077,346

(22) Filed: Dec. 8, 2022

(65) Prior Publication Data

US 2023/0128992 A1    Apr. 27, 2023

Related U.S. Application Data

(62) Division of application No. 16/646,599, filed as application No. PCT/JP2018/034148 on Sep. 14, 2018, now Pat. No. 11,548,983.

(30) Foreign Application Priority Data

Sep. 15, 2017    (JP) ................. 2017-178244

(51) Int. Cl.
| | | |
|---|---|---|
| C08G 73/18 | (2006.01) | |
| C08J 5/18 | (2006.01) | |
| H01M 8/10 | (2016.01) | |
| H01M 8/1039 | (2016.01) | |
| H01M 8/1072 | (2016.01) | |
| H05K 1/03 | (2006.01) | |

(52) U.S. Cl.
CPC ............. C08G 73/18 (2013.01); C08J 5/18 (2013.01); H01M 8/1039 (2013.01); H01M 8/1072 (2013.01); H05K 1/0373 (2013.01); H05K 1/0393 (2013.01); *C08J 2379/04* (2013.01); *H01M 2008/1095* (2013.01); *H01M 2300/0082* (2013.01)

(58) Field of Classification Search
CPC ......... C08G 73/18; C08J 5/18; C08J 2379/04; H01M 8/1039; H01M 8/1072; H01M 2008/1095; H01M 2300/0082; H05K 1/0373; H05K 1/0393
See application file for complete search history.

(56) References Cited

U.S. PATENT DOCUMENTS

| | | |
|---|---|---|
| 3,951,920 A | 4/1976 | Senoo et al. |
| 4,537,974 A | 8/1985 | Lau |
| 4,877,849 A | 10/1989 | Rafalko |
| 5,028,728 A | 7/1991 | Schneider et al. |
| 5,262,056 A | 11/1993 | Koros et al. |
| 5,807,969 A | 9/1998 | Sezi et al. |
| 5,932,688 A | 8/1999 | Murata |
| 7,396,615 B1 | 7/2008 | Yamamoto |
| 2009/0136818 A1 | 5/2009 | Fujibayashi et al. |

(Continued)

FOREIGN PATENT DOCUMENTS

| | | |
|---|---|---|
| CN | 101223211 A | 7/2008 |
| CN | 101456964 A | 6/2009 |
| CN | 106928481 A | 7/2017 |

(Continued)

OTHER PUBLICATIONS

Kane et al; "New Approaches to the Synthesis of N-Substituted Polybenzimidazoles"; Abstracts of Papers of the American Chemical Society, 1990; pp. 709-710.

(Continued)

*Primary Examiner* — Shane Fang
(74) *Attorney, Agent, or Firm* — Sughrue Mion, PLLC

(57) ABSTRACT

A polybenzimidazole production method for producing the polybenzimidazole including a repeating unit represented by the following formula (1):

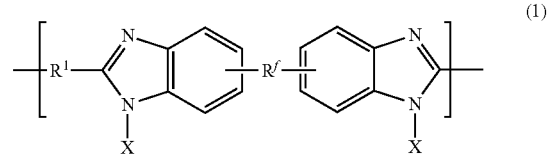

wherein $R^f$ is —$SO_2$—, —O—, —CO—, an alkylene group optionally containing a substituent, or a group represented by the following formula (a):

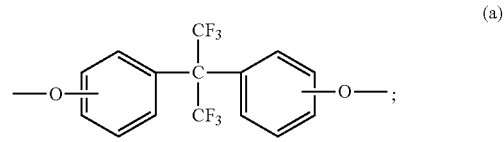

two Xs are each individually a hydrogen atom or a monovalent organic group; and $R^1$ is a divalent organic group, the production method including a step (1-1) of polymerizing a tetramine compound and a dicarboxylic acid derivative compound to provide a polybenzimidazole precursor polyamide, and a step (1-2) of dehydrocyclizing the polybenzimidazole precursor polyamide.

3 Claims, No Drawings

(56) References Cited

U.S. PATENT DOCUMENTS

2022/0251299 A1  8/2022  Oishi

FOREIGN PATENT DOCUMENTS

| JP | 09-183846 | A | 7/1997 |
|---|---|---|---|
| JP | 09-208699 | A | 8/1997 |
| JP | 2006-339064 | A | 12/2006 |
| JP | 2011-236155 | A | 11/2011 |
| JP | 2011-256219 | A | 12/2011 |
| JP | 2012-124161 | A | 6/2012 |
| JP | 2013-051145 | A | 3/2013 |
| JP | 2016-25058 | A | 2/2016 |
| KR | 10-2011-0107549 | A | 10/2011 |
| SU | 527453 | A1 | 9/1976 |
| WO | 2007/008327 | A2 | 1/2007 |

OTHER PUBLICATIONS

Korshak et al., "Synthesis and Investigation of Polybenzimidazoles Containing Alkyl Substituents in Aromatic Nuclei", Journal of Polymer Science: Part A-1, 1971, vol. 9, pp. 1027-1043 (17 pages total).

Lau et al., "Synthesis of Polymer Intermediates Containing the Hexafluoroisopropylidene Group via Functionalization of 2,2-Diphenylhexafluoropropane", Journal of Polymer Science: Polymer Chemistry Edition, 1982, vol. 20, pp. 2381-2393 (13 pages total).

Toshinari Nakajima et al., "On the Thermally Stable Polymers as Industrial Material (Polybenz Imidazole)", 1969.9, pp. 536-541, vol. 21, No. 9.

International Search Report of PCT/JP2018/034148 dated Dec. 18, 2018 [PCT/ISA/210].

International Preliminary Report on Patentability with a Translation of Written Opinion in International Application No. PCT/JP2018/034148, dated Mar. 17, 2020.

James J. Kane et al., "Synthesis of New Nitrogen Substituted Polybenzimidazoles", Materials Research Society, 1989, vol. 134, pp. 133-140 (8 pages total).

K.J. Scariah et al., "Synthesis and Properties of New Polybenzimidazoles and N-Phenyl Polybenzimidazoles with Flexibilizing Spacers on the Polymer Backbone", Journal of Polymer Science, vol. 25, 1987, pp. 2675-2687, (13 pages total).

Extended European Search Report dated Aug. 4, 2021, from the European Patent Office in counterpart application No. 18856890.1.

Kane et al., "Synthesis of N-Substituted Polybenzimidazoles by Cyclodehydrogenation of Precursor Poly(Schiff Bases)", Polymer Preprints, Aug. 1991, vol. 32, No. 3, pp. 232-233 (3 pages total).

Notice of Allowance dated Jan. 19, 2023 issued by the United States Patent and Trademark Office in U.S. Appl. No. 17/728,757.

POLYBENZIMIDAZOLE, PRECURSOR POLYAMIDE THEREOF, AND METHOD FOR PRODUCING SAME

CROSS REFERENCE TO RELATED APPLICATIONS

This application is a Rule 53(b) Divisional of U.S. application Ser. No. 16/646,599 filed Mar. 12, 2020, which is a National Stage of International Application No. PCT/JP2018/034148, filed Sep. 14, 2018, claiming priority to Japanese Patent Application No. 2017-178244, filed Sep. 15, 2017, the above-noted application incorporated herein by reference in their respective entireties.

TECHNICAL FIELD

The invention relates to colorless and transparent polybenzimidazoles soluble in a variety of organic solvents and having a high glass transition temperature and a low permittivity, precursor polyamides thereof, and methods for producing these.

BACKGROUND ART

Polybenzimidazole has excellent heat resistance, mechanical properties, and adhesiveness and is used in a variety of fields in the form of articles such as heat-resistant fibers, molded articles, and adhesives. Application of polybenzimidazole for polymer electrolyte membranes for fuel cells is examined in recent studies (for example, see Patent Literature 1).

Polybenzimidazole is synthesized and produced by melt- and solid-state polycondensation of an aromatic tetramine and an aromatic diphenyl dicarboxylate (for example, see Non-Patent Literature 1).

This technique unfortunately involves a disadvantage of partial superheating and resulting inevitable generation of insoluble matter. Another disadvantage is wear of metal material used in production devices and resulting mixing of a large amount of metal impurities in polybenzimidazole (for example, see Patent Literature 2).

Another simple and easy method for synthesizing polybenzimidazole developed is solution polycondensation. Specifically, this is a direct polymerization technique in which an aromatic tetramine and an aromatic dicarboxylic acid are subjected to solution polycondensation using polyphosphoric acid or a mixture of phosphorus pentoxide and methanesulfonic acid as a polymerization solvent and as a condensation agent. This technique involves a disadvantage of a residual phosphorus compound in polybenzimidazole and an issue relating to handling of phosphoric acid after the polymerization. A known method for synthesizing polybenzoxazole without halogens and phosphorus is an active diester technique. This method provides poly(o-hydroxyamide), which is a polybenzoxazole precursor, using a benzotriazole-based active diester or a triazine-based active diester (for example, see Patent Literature documents 3 and 4).

The poly(o-hydroxyamide) precursor synthesized by this technique and polybenzoxazole obtainable from this precursor are reported to contain a significantly small amount of impurities and are useful for applications such as electric/electronic components and optical components.

CITATION LIST

Patent Literature

Patent Literature 1: JP 2012-124161 A
Patent Literature 2: JP H09-208699 A
Patent Literature 3: JP H09-183846 A
Patent Literature 4: JP 2011-256219 A Non-Patent Literature Non-Patent Literature 1: Toshinari NAKAJIMA, Nobuyuki GOTO, "Tainetsu-sei Kobunshi Zairyo (Heat-resistant polymer materials)", Seisan Kenkyu, 1969, Vol. 21, No. 9, pp. 536-541

SUMMARY OF INVENTION

Technical Problem

In view of the above current state of the art, the invention aims to provide a fluorine-containing polybenzimidazole having excellent heat resistance as well as excellent solubility in solvents, electric insulation, and colorless transparency.

Solution to Problem

The inventors performed studies to solve the above problems, and found that polycondensation of a mildly reactive dicarboxylic acid derivative compound and a fluorine-containing aromatic tetramine can provide a polyamide, and this polyamide can be used to provide a polybenzimidazole, thereby completing the invention.

In other words, the invention relates to a polybenzimidazole containing a repeating unit represented by the following formula (1):

[Chem. 1]

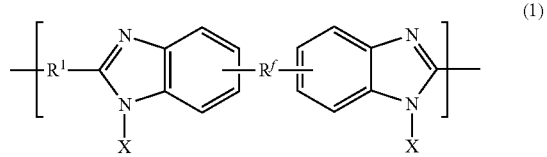

wherein
$R^f$ is —$SO_2$—, —O—, —CO—, an alkylene group optionally containing a substituent, or a group represented by the following formula:

[Chem. 2]

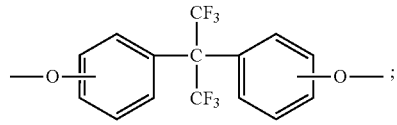

two Xs are each individually a hydrogen atom or a monovalent organic group; and
$R^1$ is a divalent organic group.
$R^f$ is preferably a fluorine-substituted alkylene group. $R^f$ is also preferably —$C(CF_3)_2$—.

The polybenzimidazole preferably has a number average molecular weight by gel permeation chromatography (GPC) of 2000 or higher in a polystyrene standard equivalent.

The invention also relates to a polybenzimidazole precursor polyamide (hereinafter, also simply referred to as polyamide) containing a repeating unit represented by the following formula (2):

[Chem. 3]

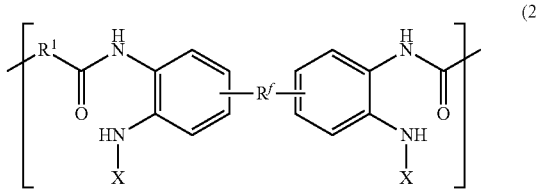
(2)

wherein

R$^f$ is —SO$_2$—, —O—, —CO—, an alkylene group optionally containing a substituent, or a group represented by the following formula:

[Chem. 4]

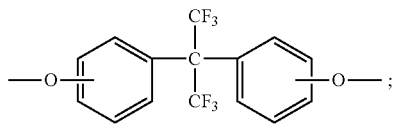

two Xs are each individually a hydrogen atom or a monovalent organic group; and

R$^1$ is a divalent organic group.

R$^f$ is preferably a fluorine-substituted alkylene group. R$^f$ is also preferably —C(CF$_3$)$_2$—.

The polybenzimidazole precursor polyamide preferably has a number average molecular weight by gel permeation chromatography (GPC) of 2000 or higher in a polystyrene standard equivalent.

The invention also relates to a polyamide production method for producing the polybenzimidazole precursor polyamide, the method including: a step (1-1) of polymerizing a tetramine compound (3) represented by the following formula (3) and a dicarboxylic acid derivative compound (4) represented by the following formula (4) to provide the polybenzimidazole precursor polyamide containing a repeating unit represented by the formula (2), the formula (3) being as follows:

[Chem. 5]

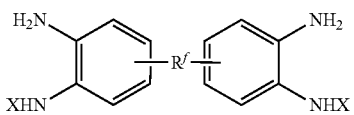
(3)

wherein

R$^f$ is —SO$_2$—, —O—, —CO—, an alkylene group optionally containing a substituent, or a group represented by the following formula:

[Chem. 6]

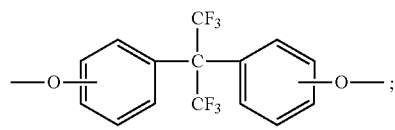

and two Xs are each individually a hydrogen atom or a monovalent organic group, the formula (4) being as follows:

[Chem. 7]

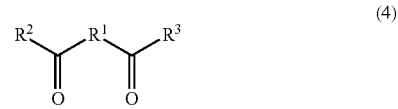
(4)

wherein

R$^1$ is a divalent organic group; and

R$^2$ and R$^3$ are each individually OH, a linear or branched alkoxy group, an aromatic oxy group optionally containing a substituent, or a halogen atom.

R$^f$ is preferably a fluorine-substituted alkylene group. R$^f$ is also preferably —C(CF$_3$)$_2$—.

The invention also relates to a polybenzimidazole production method for producing the polybenzimidazole, the method including:

a step (1-1) of polymerizing a tetramine compound (3) represented by the following formula (3) and a dicarboxylic acid derivative compound (4) represented by the following formula (4) to provide a polybenzimidazole precursor polyamide containing a repeating unit represented by the following formula (2); and a step (1-2) of dehydrocyclizing the polybenzimidazole precursor polyamide to provide the polybenzimidazole containing a repeating unit represented by the formula (1), the formula (2) being as follows:

[Chem. 8]

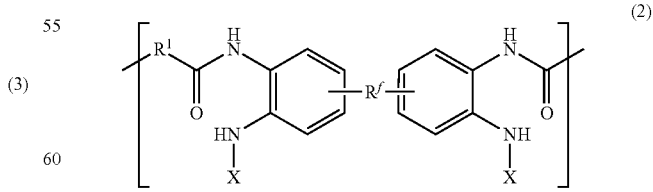
(2)

wherein

R$^f$ is —SO$_2$—, —O—, —CO—, an alkylene group optionally containing a substituent, or a group represented by the following formula:

[Chem. 9]

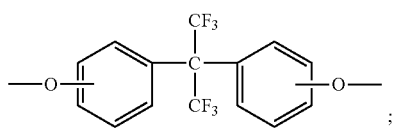

two Xs are each individually a hydrogen atom or a monovalent organic group; and R¹ is a divalent organic group, the formula (3) being as follows:

[Chem. 10]

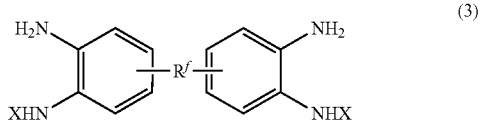

(3)

wherein
R$^f$ is —SO$_2$—, —O—, —CO—, an alkylene group optionally containing a substituent, or a group represented by the following formula:

[Chem. 11]

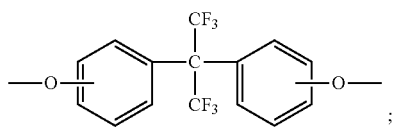

and
two Xs are each individually a hydrogen atom or a monovalent organic group,
the formula (4) being as follows:

[Chem. 12]

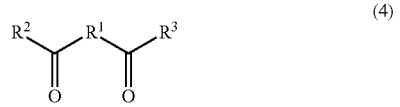

(4)

wherein
R¹ is a divalent organic group; and
R² and R³ are each individually OH, a linear or branched alkoxy group, an aromatic oxy group optionally containing a substituent, or a halogen atom.

R$^f$ is preferably a fluorine-substituted alkylene group. R$^f$ is also preferably —C(CF$_3$)$_2$—.

The invention also relates to a film containing the polybenzimidazole.

The invention also relates to a flexible wiring board including the film.

The invention also relates to a printed circuit board including the film.

The invention also relates to a polymer electrolyte membrane for a fuel cell, the polymer electrolyte membrane including the film.

Advantageous Effects of Invention

The polybenzimidazole of the invention has excellent heat resistance as well as excellent solubility in solvents, electric insulation, colorless transparency, and flexibility. Thus, the polybenzimidazole can suitably be used for applications such as films, polymer electrolyte membranes, and resist materials.

The polyamide of the invention can suitably be used as a material of the polybenzimidazole of the invention.

The polyamide production method of the invention can suitably provide the polyamide of the invention.

The polybenzimidazole production method of the invention can suitably provide the polybenzimidazole of the invention.

The film of the invention contains the polybenzimidazole of the invention, and thus has excellent heat resistance, high solubility in solvents, high transparency, and low permittivity. Accordingly, the film can suitably be used for applications such as flexible wiring boards, printed circuit boards, optical components, polymer electrolyte membranes for fuel cells, and resist materials.

DESCRIPTION OF EMBODIMENTS

The invention will be specifically described hereinbelow.

The term "aromatic group" herein means a monovalent group containing an aromatic ring and encompasses an aromatic hydrocarbon ring group and an aromatic heterocyclic group unless otherwise mentioned.

The aromatic hydrocarbon ring group preferably includes a 6-membered aromatic hydrocarbon ring. The aromatic hydrocarbon ring group may be monocyclic, bicyclic, or tricyclic.

The aromatic heterocyclic group preferably includes a 5- or 6-membered aromatic heterocycle. The aromatic heterocycle contains one or more hetero atoms. Examples of the hetero atoms include a nitrogen atom, an oxygen atom, and a sulfur atom. Preferred among these is a nitrogen atom. The aromatic heterocyclic group may be monocyclic, bicyclic, or tricyclic.

The term "substituent" herein means a group that can substitute for another atom or group unless otherwise mentioned. Examples of the "substituent" include an aliphatic group, an alicyclic group, an aromatic group, a heterocyclic group, an acyl group, an acyloxy group, an acylamino group, an aliphatic oxy group, an aromatic oxy group, a heterocyclic oxy group, an aliphatic oxycarbonyl group, an aromatic oxycarbonyl group, a heterocyclic oxycarbonyl group, a carbamoyl group, an aliphatic sulfonyl group, an aromatic sulfonyl group, a heterocyclic sulfonyl group, an aliphatic sulfonyloxy group, an aromatic sulfonyloxy group, a heterocyclic sulfonyloxy group, a sulfamoyl group, an aliphatic sulfonamide group, an aromatic sulfonamide group, a heterocyclic sulfonamide group, an amino group, an aliphatic amino group, an aromatic amino group, a heterocyclic amino group, an aliphatic oxycarbonylamino group, an aromatic oxycarbonylamino group, a heterocyclic oxycarbonylamino group, an aliphatic sulfinyl group, an aromatic sulfinyl group, an aliphatic thio group, an aromatic thio group, a hydroxy group, a cyano group, a sulfo group, a carboxy group, an aliphatic oxyamino group, an aromatic oxyamino group, a carbamoyl amino group, a sulfamoylamino group, a halogen atom, a sulfamoylcarbamoyl group, a carbamoylsulfamoyl group, a dialiphatic oxyphosphinyl group, and a diaromatic oxyphosphinyl group.

The invention relates to a novel polybenzimidazole containing a repeating unit represented by the formula (1).

The formula (1) is as follows:

[Chem. 13]

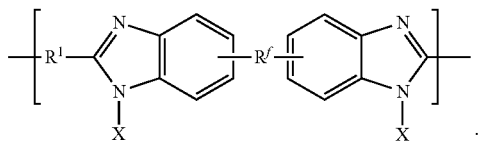
(1)

In the formula (1), $R^f$ is —SO$_2$—, —O—, —CO—, an alkylene group optionally containing a substituent, or a group represented by the following formula:

[Chem. 14]

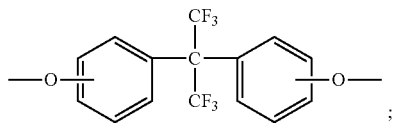

and two Xs are each individually a hydrogen atom or a monovalent organic group.

In the alkylene group optionally containing a substituent, the substituent is preferably a halogen atom, more preferably a fluorine atom. The alkylene group may be either linear or branched, and the number of carbon atoms constituting the alkylene group is preferably 1 to 6.

In the fluorine-substituted alkylene group, one or a plurality of the hydrogen atoms may be replaced by fluorine. More preferably, all hydrogen atoms are replaced by fluorine. The fluorine-substituted alkylene group preferably has a carbon number of 1 to 6, more preferably 1 to 3. Specific examples of the fluorine-substituted alkylene group include —CHF—, —CF$_2$—, —CF$_2$CH$_2$—, —CF$_2$CF$_2$—, —CH$_2$CF$_2$—, —CH$_2$CH$_2$CF$_2$—, —CH$_2$CF$_2$CH$_2$—, —CH$_2$CF$_2$CF$_2$—, —CF$_2$CH$_2$CH$_2$—, —CF$_2$CF$_2$CH$_2$—, —CF$_2$CH$_2$CF$_2$—, —CF$_2$CF$_2$CF$_2$—, —C(CF$_3$)H—, —C(CF$_3$)F—, —C(CH$_3$)F—, —C(CF$_3$)$_2$—, —C(CF$_3$)(CH$_3$)—, —C(CF$_3$)FCF$_2$—, —C(CF$_3$)FCH$_2$—, —C(CF$_3$)HCH$_2$—, —C(CH$_3$)FCH$_2$—, —C(CH$_3$)FCF$_2$—, —C(CH$_3$)HCF$_2$—, and —C(CF$_3$)HCF$_2$—. Preferred among these are —C(CF$_3$)$_2$— and —CF$_2$CF$_2$—, more preferred is —C(CF$_3$)$_2$—.

$R^f$ is preferably a fluorine-substituted alkylene group. Preferred are —C(CF$_3$)$_2$— and —CF$_2$CF$_2$—. More preferred is —C(CF$_3$)$_2$—.

The monovalent organic group is a monovalent group containing a carbon atom or a group obtainable by removing one hydrogen atom from an organic compound. Examples of the monovalent organic group include an aliphatic hydrocarbon group optionally containing a substituent and an aromatic group optionally containing a substituent.

Specific examples of the monovalent organic group include lower alkyl groups having a carbon number of 1 to 10, particularly 1 to 6, such as —CH$_3$, —C$_2$H$_5$, and —C$_3$H$_7$; fluorine atom-containing lower alkyl groups having a carbon number of 1 to 10, particularly 1 to 6, such as —CF$_3$, —C$_2$F$_5$, —CH$_2$F, —CH$_2$CF$_3$, and —CH$_2$C$_2$F$_5$; a phenyl group (containing no substituent); a benzyl group (containing no substituent); groups obtainable by replacing 1 to 5 hydrogen atoms by fluorine atoms in a phenyl or benzyl group, such as —C$_6$F$_5$ and —CH$_2$C$_6$F$_5$; and groups obtainable by replacing 1 to 5 hydrogen atoms by —CF$_3$ in a phenyl or benzyl group, such as —C$_6$H$_{5-n}$(CF$_3$)$_n$ and —CH$_2$C$_6$H$_{5-n}$(CF$_3$)$_n$ (wherein n is an integer of 1 to 5).

Xs are each preferably a monovalent organic group, more preferably an aromatic group optionally containing a substituent.

In the formula (1), $R^1$ is a divalent organic group. The divalent organic group is a divalent group containing a carbon atom or a group obtainable by removing two hydrogen atoms from an organic compound. Examples of the divalent organic group include an alkylene group optionally containing a substituent and optionally containing an ether bond; and an arylene group optionally containing a substituent and optionally containing an ether bond. The substituent that the alkylene group or the arylene group optionally contains is preferably a halogen atom or an alkyl group optionally substituted with a halogen atom, more preferably a fluorine atom or a fluorinated alkyl group.

$R^1$ is preferably any of the following:

[Chem. 15]

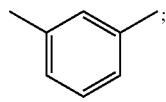

[Chem. 16]

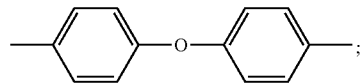

[Chem. 17]

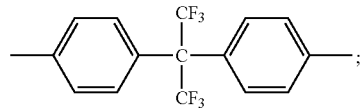

and —(CF$_2$)$_n$— (wherein n is an integer of 1 to 8).

In the polybenzimidazole of the invention, one type of $R^1$ may be present or multiple types thereof may be present.

The repeating unit represented by the formula (1) preferably includes a repeating unit represented by the following formula (1-1):

[Chem. 18]

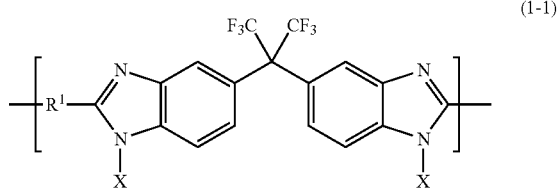
(1-1)

(wherein X and $R^1$ are defined as described above) and a repeating unit represented by the following formula (1-2):

[Chem. 19]

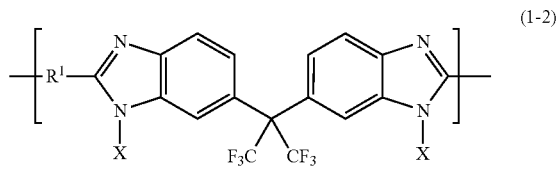
(1-2)

(wherein X and $R^1$ are defined as described above).

In the polybenzimidazole of the invention, one type of the repeating unit represented by the formula (1) may be present or multiple types thereof may be present.

The polybenzimidazole of the invention preferably has a number average molecular weight of 2000 or higher. The number average molecular weight is more preferably 10000 or higher, while preferably 500000 or lower, more preferably 200000 or lower.

The number average molecular weight can be determined by gel permeation chromatography (GPC).

The polybenzimidazole of the invention preferably has a weight average molecular weight by gel permeation chromatography (GPC) of 5000 or higher in a polystyrene standard equivalent. The weight average molecular weight is more preferably 10000 or higher, while preferably 1000000 or lower.

The invention also relates to a novel polybenzimidazole precursor polyamide containing a repeating unit represented by the formula (2).

The formula (2) is as follows:

[Chem. 20]

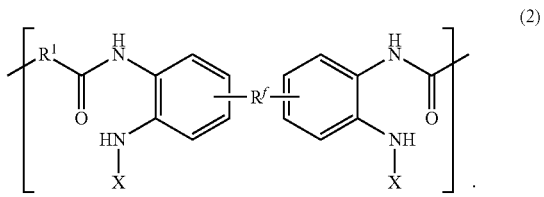
(2)

In the formula (2), two Xs are each individually a hydrogen atom or a monovalent organic group; and $R^1$ is a divalent organic group. X, $R^f$, and $R^1$ are defined as described above.

The repeating unit represented by the formula (2) preferably includes a repeating unit represented by the following formula (2-1):

[Chem. 21]

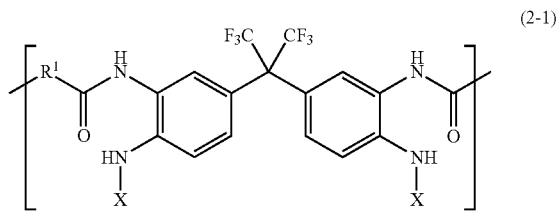
(2-1)

(wherein X and $R^1$ are defined as described above) and a repeating unit represented by the following formula (2-2):

[Chem. 22]

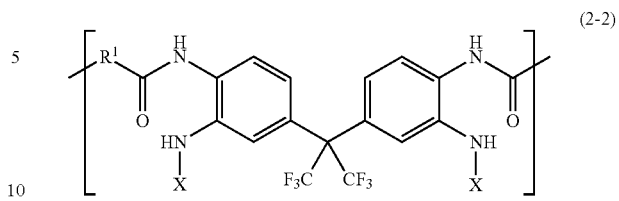
(2-2)

(wherein X and $R^1$ are defined as described above).

In the polyamide of the invention, one type of the repeating unit represented by the formula (2) may be present or multiple types thereof may be present.

The polyamide of the invention preferably has a number average molecular weight of 2000 or higher. The number average molecular weight is more preferably 10000 or higher, while preferably 500000 or lower, more preferably 200000 or lower. A polyamide having a number average molecular weight of lower than 2000 may have poor film formability and insufficiently exhibit its properties as a polybenzimidazole precursor polyamide. A polyamide having a number average molecular weight of higher than 500000 may have so high a molecular weight that the polyamide may have poor solubility in solvents and poor molding processibility.

The number average molecular weight can be determined by gel permeation chromatography (GPC).

The polyamide of the invention preferably has a weight average molecular weight by gel permeation chromatography (GPC) of 5000 or higher in a polystyrene standard equivalent. The weight average molecular weight is more preferably 10000 or higher, while preferably 1000000 or lower.

The polyamide of the invention can suitably be produced by a production method including a step (1-1) of polymerizing a tetramine compound (3) represented by the following formula (3) and a dicarboxylic acid derivative compound (4) represented by the following formula (4) to provide a polybenzimidazole precursor polyamide containing a repeating unit represented by the formula (2). This production method is also one aspect of the invention.

The formula (3) is as follows:

[Chem. 23]

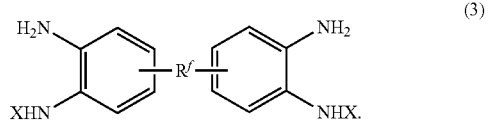
(3)

The formula (4) is as follows:

[Chem. 24]

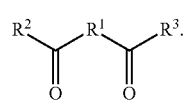
(4)

In the formula (3), two Xs are each individually a hydrogen atom or a monovalent organic group. X and $R^f$ are defined as described above.

The tetramine compound (3) is preferably any of a compound represented by the following formula (3-1):

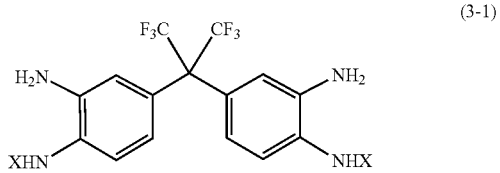

(3-1)

(wherein X is defined as described above) and a compound represented by the following formula (3-2):

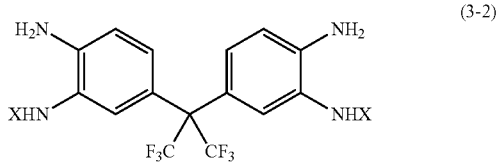

(3-2)

(wherein X is defined as described above).

In the formula (4), $R^1$ is a divalent organic group, and $R^2$ and $R^3$ are each individually OH, a linear or branched alkoxy group, an aromatic oxy group optionally containing a substituent, or a halogen atom. $R^1$ is defined as described above.

The alkoxy group for $R^2$ and $R^3$ preferably has a carbon number of 1 to 12, more preferably 1 to 6.

The substituent that the aromatic oxy group for $R^2$ and $R^3$ optionally contains is preferably an alkoxy group, an alkyl group, a fluoroalkyl group, a halo group (halogen atom), a nitro group, a cyano group, or an ester group, more preferably an alkoxy group.

Examples of the aromatic oxy group for $R^2$ and $R^3$ include a phenoxy group (containing no substituent) and a triazinyloxy group optionally containing a substituent.

$R^2$ and $R^3$ are each preferably OH, a phenoxy group (containing no substituent), a methoxy group, an ethoxy group, a chlorine atom, and a group represented by the following formula:

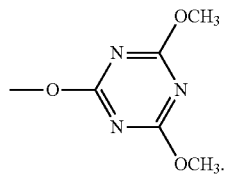

In the polymerization of the step (1-1), 0.5 to 1.5 mol of the dicarboxylic acid derivative compound (4) is preferably used for 1 mol of the tetramine compound (3).

The polymerization of the step (1-1) can be performed in a solvent. Preferably, the solvent has a characteristic of being substantially non-reactive with the dicarboxylic acid derivative compound (4) and favorably dissolving the tetramine compound (3) and is a good solvent against a polybenzimidazole precursor polyamide that is a reaction product. Examples of such a solvent include, but are not limited to, dimethyl sulfoxide (DMSO), N,N-dimethylformamide (DMF), N,N-dimethylacetamide (DMAc), N-methyl-2-pyrrolidone (NMP), 1,3-dimethylimidazolidone (DMI), sulfolane, tetrahydrofuran (THF), and acetone. Preferred among these are N-methyl-2-pyrrolidone (NMP) and 1,3-dimethylimidazolidone (DMI). These solvents are usually used in an amount of 10 to 1000 mL, preferably 50 to 400 mL, relative to 0.1 mol of the tetramine compound (3) used.

The polymerization of the step (1-1) can also be performed in the presence of an additive. For example, in order to provide a polybenzimidazole precursor polyamide having a high molecular weight, an inorganic salt such as lithium chloride or calcium chloride may be added. Preferred among these is lithium chloride.

The additive is preferably usually used in an amount of 10% by mass or less, more preferably 5% by mass or less, relative to the amount of the solvent used.

In a specific embodiment of the step (1-1), for example, the tetramine compound (3) is dissolved in an inert solvent, the dicarboxylic acid derivative compound (4) is added thereto, and they are reacted while stirred in an inert atmosphere such as nitrogen, whereby a polybenzimidazole precursor polyamide can be obtained. The polymerization temperature is preferably −50° C. to 100° C., more preferably −30° C. to 50° C.

The polymerization duration in the step (1-1) is preferably 0.1 to 50 hours, more preferably 1 to 24 hours.

After the step (1-1) is completed, the reaction mixture may be put into a poor solvent such as methanol or water so that the polymer is separated, and then the polymer may be purified by reprecipitation so that by-products and inorganic salts are easily removed, whereby a polybenzimidazole precursor polyamide having high purity can be obtained.

The polybenzimidazole of the invention can suitably be produced by a production method including: a step (1-1) of polymerizing a tetramine compound (3) represented by the formula (3) and a dicarboxylic acid derivative compound (4) represented by the formula (4) to provide a polybenzimidazole precursor polyamide containing a repeating unit represented by the formula (2); and a step (1-2) of dehydrocyclizing the polybenzimidazole precursor polyamide to provide a polybenzimidazole containing a repeating unit represented by the formula (1). This production method is also one aspect of the invention.

The step (1-1) is the same as described above. The polyamide obtained in the step (1-1) in the form of a crude product may be supplied as it is to the step (1-2), or may be isolated and purified after the step (1-1) and before the step (1-2).

The dehydrocyclization of the step (1-2) can be performed by heating the polyamide, whereby a polybenzimidazole having high purity can be obtained.

The heating temperature is preferably 250° C. to 550° C., more preferably 350° C. to 470° C.

The heating duration is preferably 0.1 to 2 hours, more preferably 0.2 to 1 hours.

The dehydrocyclization of the step (1-2) can be performed in the air, in a nitrogen or argon atmosphere, or under reduced pressure.

The polybenzimidazole of the invention can also suitably be produced by a production method including a step (2-1) of polymerizing a tetramine compound (3) represented by the formula (3) and a compound (5) represented by the following formula (5) to provide a polybenzimidazole containing a repeating unit represented by the formula (1).

The formula (5) is as follows.

$$Y-R^1-Y \qquad (5)$$

In the formula (5), $R^1$ is a divalent organic group; and two Ys are each individually —CN or —COOR$^4$ (wherein $R^4$ is H, a linear or branched alkyl group, or an aromatic group optionally containing a substituent). $R^1$ is defined as described above.

The alkyl group for $R^4$ preferably has a carbon number of 1 to 6, more preferably 1 to 3.

Examples of the aromatic group for $R^4$ include a phenyl group optionally containing a substituent and a triazinyl optionally containing a substituent.

Y is preferably —CN among these.

In the polymerization of the step (2-1), 0.5 to 1.5 mol of the compound (5) is preferably used for 1 mol of the tetramine compound (3).

The polymerization of the step (2-1) is preferably performed in the absence of a solvent. Still, the polymerization may be performed in a solvent. The solvent in the case of polymerization in a solvent is preferably an organic solvent. Examples thereof include dimethyl sulfoxide (DMSO), N,N-dimethylformamide (DMF), N,N-dimethylacetamide (DMAc), N-methyl-2-pyrrolidone (NMP), 1,3-dimethylimidazolidone (DMI), and sulfolane. Preferred among these are N-methyl-2-pyrrolidone (NMP) and sulfolane.

The polymerization of the step (2-1) can also be performed in the presence of an additive. Examples of the additive include lithium chloride and calcium chloride. Preferred among these is lithium chloride.

The additive is preferably usually used in an amount of 10% by mass or less, more preferably 5% by mass or less, relative to the amount of the solvent used.

The polymerization temperature in the step (2-1) is preferably 10° C. to 400° C., more preferably 70° C. to 300° C.

The polymerization pressure in the step (2-1) is preferably 0.01 to 1.0 MPa, more preferably 0.05 to 0.2 MPa.

The polymerization duration in the step (2-1) is preferably 0.1 to 60 hours, more preferably 3 to 40 hours.

After the step (2-1) is completed, the reaction mixture may be put into a poor solvent such as methanol or water so that the polymer is separated, and then the polymer may be purified by reprecipitation so that by-products and inorganic salts are easily removed. Thereby, a polybenzimidazole having high purity can be obtained.

The polybenzimidazole of the invention has excellent heat resistance as well as excellent solubility in solvents, electric insulation, colorless transparency, and flexibility. Thus, the polybenzimidazole can suitably be used for applications such as films, polymer electrolyte membranes, and resist materials. Preferred among these are films. The polybenzimidazole of the invention has excellent solubility in solvents, and thus can be easily formed into a thin film. The polybenzimidazole of the invention also has flexibility that a film needs to have.

The film can be produced by molding the polybenzimidazole of the invention by a known film molding technique such as extrusion molding, calender molding, or solution casting. Alternatively, a solution of the aforementioned polyamide of the invention may be cast and heated. In this case, generation of a polybenzimidazole by dehydrocyclization of the polyamide and film formation can be achieved simultaneously.

The invention also relates to a film containing the aforementioned polybenzimidazole of the invention. The film of the invention has high solubility in solvents, high transparency, and low permittivity.

In production of the film of the invention, preferably, the polybenzimidazole precursor polyamide is dissolved in a solvent such as N,N-dimethylacetamide (DMAc) or tetrahydrofuran (THF) at a concentration of 15 to 20% by mass, the solution is cast on a glass plate, and then heated for dehydrocyclization. Alternatively, the polybenzimidazole may be dissolved in a solvent such as dimethyl sulfoxide (DMSO), N,N-dimethylformamide (DMF), or N-methyl-2-pyrrolidone (NMP) and the solution may be treated as described above, whereby a cast film may be produced.

The film of the invention preferably has a d-line refractive index ($n_d$) of 1.70 or lower, more preferably 1.65 or lower.

The refractive index is a value determined using Model 2010/M Prism Coupler available from Metricon Corp.

The film of the invention has a low permittivity and excellent insulation. The permittivity (s) of the film is preferably 3.2 or lower, more preferably 3.0 or lower.

The permittivity (s) is a value calculated using the d-line average refractive index ($n_{ave}$) ($\varepsilon = 1.10 \times n_{ave}^2$).

A film formed from a solution of the polybenzimidazole of the invention or the polyamide mixed with a blowing agent can be a foamed film having a much lower permittivity. An example of the blowing agent is 2-hydroxy-4,6-dimethoxy-1,3,5-triazine decomposable at low temperature (170° C. or higher).

The film of the invention preferably has a thickness of 5 to 100 μm, more preferably 10 to 40 μm.

The film of the invention can suitably be used as a base film of a flexible wiring board or a printed circuit board, or an optical film, for example. A flexible wiring board or a printed circuit board including the film of the invention is also one aspect of the invention. A polymer electrolyte membrane for a fuel cell including the film of the invention is also one aspect of the invention.

EXAMPLES

The invention is described in more detail with reference to examples. Still, the invention is not intended to be limited by these examples. The devices used are as follows.

(1) FT-IR: FT/IR-4200 available from JASCO Corp.

(2) $^1$H-NMR: DRX400 available from Bruker Corp.

(3) GPC: High performance GPC system HLC-8220GPC available from Tosoh Corp. (column: TSK-GEL (α-M) available from Tosoh Corp., column temperature: 45° C., detector: UV-8020, wavelength: 254 nm, eluent: N-methyl-2-pyrrolidone (NMP) (containing 0.01 mol/L lithium bromide), calibration curve: polystyrene standard, column flow rate: 0.2 mL/min)

(4) Differential scanning calorimeter (DSC): DSC 7000 available from Hitachi High-Tech Science Corp.

(5) Thermomechanical analysis (TMA): TMA 7000 available from Hitachi High-Tech Science Corp.

(6) Dynamic mechanical analyzer (DMA): DMA 7100 available from Hitachi High-Tech Science Corp.

(7) Thermogravimetry/differential thermal analysis (TG/DTA): TG/DTA 7300 available from Hitachi High-Tech Science Corp.

(8) Ultraviolet-visible spectrophotometer: UV-1800 available from Shimadzu Corp.

(9) Refractive index measurement: Model 2010/M PRISM COUPLER available from Metricon Corp.

Synthesis of Polybenzimidazole Precursor Polyamide

Example 1

Synthesis of Polyamide (PA (OBBT-PhTA))

[Chem. 28]

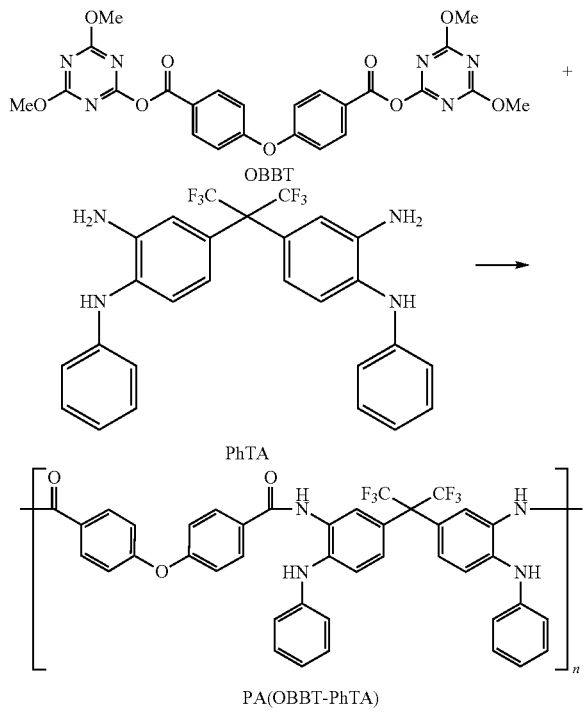

PA(OBBT-PhTA)

A 100 mL three-neck flask equipped with a stirrer, a thermometer, and a nitrogen inlet tube was dried with a heat gun under a nitrogen stream, and then charged with 1.290 g (2.50 mmol) of 2,2-bis(3-amino-4-anilinophenyl)hexafluoropropane (PhTA) and 5 mL of NMP. These components were completely dissolved. The system was then cooled down to 10° C. Thereto was added 1.341 g (2.50 mmol) of a triazine-based active diester (OBBT), and the components were allowed to react at 10° C. for six hours.

After completion of the reaction, the reaction solution was put into 500 mL of methanol so that a polymer precipitate was obtained. The polymer precipitate was collected by suction filtration and dried under reduced pressure at room temperature for 12 hours. The crude yield was 99%. The dry polymer was dissolved in NMP, and then purified by reprecipitation in methanol, whereby 2-hydroxy-4,6-dimethoxy-1,3,5-triazine as a leaving component was removed. The polymer precipitate was collected by suction filtration and dried under reduced pressure at room temperature for 12 hours. Thereby, a flaky pale yellow PA (OBBT-PhTA) (actual yield: 1.31 g, percent yield: 71%) was obtained. $^1$H-NMR was performed to confirm generation of the polyamide.

The physical properties of this polyamide were determined. The results are shown below.

FT-IR (film, cm$^{-1}$): 1652 (C=O), 1599 (C=C), 1243 (C—O—C), 1169 (C—F)

$^1$H-NMR (DMSO-d$_6$, ppm): 6.87 (t, 2H, Ar—H), 7.06 (d, 4H, Ar—H), 7.13 (d, 2H, Ar—H), 7.19 (d, 4H, Ar—H), 7.26 (t, 4H, Ar—H), 7.35 (d, 4H, Ar—H), 7.63 (s, 2H, Ar—H), 7.71 (s, 2H, Ar—NH), 8.01 (d, 2H, Ar—H), 9.86 (s, 2H, NHCO)

Logarithmic viscosity: 0.52 dL/g (NMP solution at a concentration of 0.5 g/dL, measured at 30° C.)

GPC: $M_n$=24000, $M_w$=48000, $M_w/M_n$=2.0

Solubility: 20 wt % dissolved in NMP, DMAc, DMF, DMSO, and THF

The polyamide was dissolved in DMAc to provide a polymer solution at a concentration of 20 wt %. This polymer solution was cast on a glass plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible, colorless and transparent polyamide film (21 μm) was produced. This film was used to evaluate the thermal properties and optical properties.

Thermal Properties

Glass transition temperature: 278° C. (TMA)

Weight loss by dehydrocyclization: 4.0% weight loss from 300° C. (theoretical value: 4.9%)

Coefficient of thermal expansion: 66 ppm/° C. (150° C. to 200° C.)

Optical Properties

Cut-off wavelength: 348 nm

Light transmittance at 500 nm: 84% d-Line refractive index ($n_d$): 1.643 (in-plane), 1.643 (out-of-plane)

Average refractive index ($n_{ave}$): 1.643

Permittivity (ε): 2.96

Example 2

Synthesis of Polyamide (PA (OBBT-Vs8))

[Chem. 29]

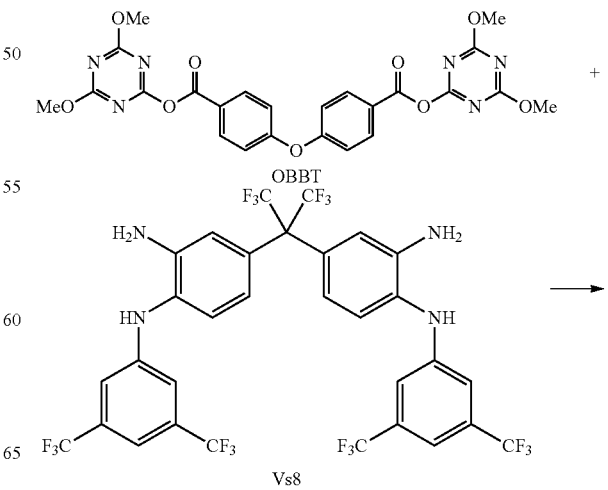

Vs8

-continued

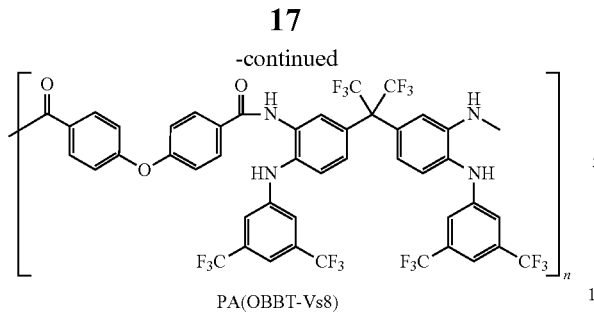

PA(OBBT-Vs8)

A 100 mL three-neck flask equipped with a stirrer, a thermometer, and a nitrogen inlet tube was dried with a heat gun under a nitrogen stream, and then charged with 1.183 g (1.50 mmol) of 2,2-bis-3-amino-4-(bistrifluoromethyl-anilinophenyl)hexafluoropropane (Vs8) and 3 mL of NMP. These components were completely dissolved at room temperature. Thereto was added 0.805 g (1.50 mmol) of a triazine-based active diester (OBBT), and the components were allowed to react at 20° C. for six hours.

After completion of the reaction, the reaction solution was put into 500 mL of distilled water so that a polymer precipitate was obtained. The polymer precipitate was collected by suction filtration and dried under reduced pressure at room temperature for 12 hours. The crude yield was 92%. The dry polymer was dissolved in NMP, and then purified by reprecipitation in methanol. The polymer precipitate was collected by suction filtration and dried under reduced pressure at room temperature for 12 hours. Thereby, a powdery pale yellow PA (OBBT-Vs8) (actual yield: 1.61 g, percent yield: 42%) was obtained. $^1$H-NMR was performed to confirm generation of the polyamide.

The physical properties of this polyamide were determined. The results are shown below.

FT-IR (KBr, cm$^{-1}$): 1661 (C=O), 1598 (C=C), 1249 (0-C), 1169 (C—F)

$^1$H-NMR (DMSO-d$_6$, ppm): 7.08 (d, 4H, Ar—H), 7.23 (d, 2H, Ar—H), 7.30 (s, 2H, Ar—H), 7.44 (s, 4H, Ar—H), 7.49 (d, 2H, Ar—H), 7.75 (s, 2H, NH), 7.95 (d, 4H, Ar—H), 8.63 (s, 2H, Ar—H), 9.90 (s, 2H, NHCO)

Logarithmic viscosity: 0.13 dL/g (0.5 g/dL concentration in NMP, measured at 30° C.)

GPC: $M_n$=2000, $M_w$=4000, $M_w/M_n$=2.0

Solubility: 20 wt % dissolved in NMP, DMAc, DMF, DMSO, and THF

The polyamide was dissolved in DMAc to provide a polymer solution at a concentration of 20 wt %. This polymer solution was cast on a quartz plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a colorless and transparent polyamide film was produced. This film was used to evaluate the optical properties.

Thermal Properties

Glass transition temperature: 218° C. (DSC)

Weight loss by dehydration: 3.0% weight loss from 290° C. (theoretical value: 3.6%)

Optical Properties Cut-off wavelength: 350 nm Light transmittance at 500 nm: 83%

Example 3

Synthesis of Polyamide (PA (IPBT-PhTA))

[Chem. 30]

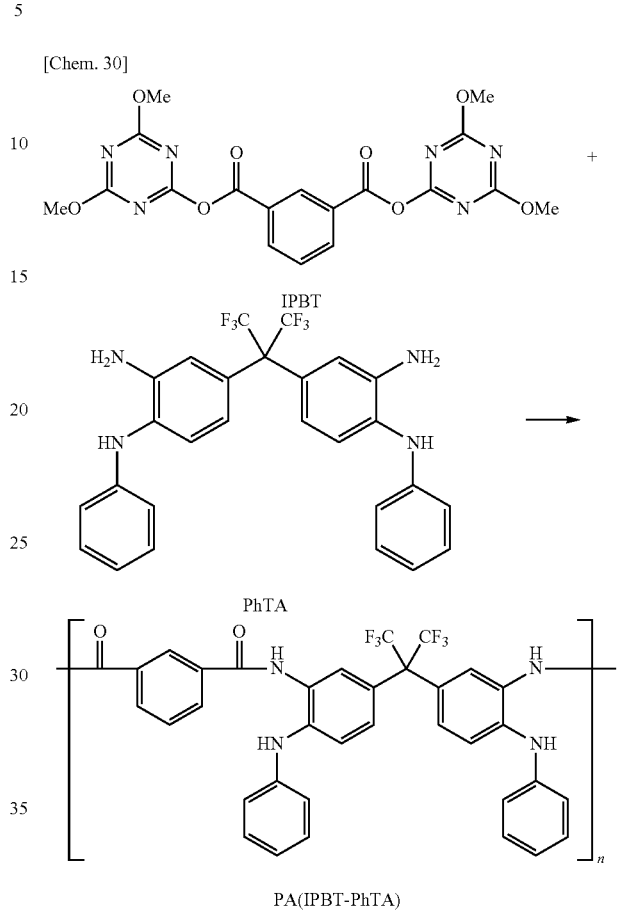

PA(IPBT-PhTA)

A 100 mL three-neck flask equipped with a stirrer, a thermometer, and a nitrogen inlet tube was dried with a heat gun under a nitrogen stream, and then charged with 1.290 g (2.50 mmol) of 2,2-bis(3-amino-4-anilinophenyl)hexafluoropropane (PhTA) and 5 mL of NMP. These components were completely dissolved. The system was then cooled down to 10° C. Thereto was added 1.111 g (2.50 mmol) of a triazine-based active diester (IPBT), and the components were allowed to react at 10° C. for six hours.

After completion of the reaction, the reaction solution was put into 500 mL of methanol so that a polymer precipitate was obtained. The polymer precipitate was collected by suction filtration and dried under reduced pressure at room temperature for 12 hours. The crude yield was 90%. The dry polymer was dissolved in NMP, and then purified by reprecipitation in methanol, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery pale yellow PA (IPBT-PhTA) (actual yield: 0.84 g, percent yield: 51%) was obtained. $^1$H-NMR was performed to confirm generation of the polyamide.

The physical properties of this polyamide were determined. The results are shown below.

FT-IR (film, cm$^{-1}$): 1666 (C=O), 1598 (C=C), 1497 (C=C), 1171 (C—F)

¹H-NMR (DMSO-d₆, ppm): 6.83 (t, 2H, Ar—H), 7.05 (d, 4H, Ar—H), 7.09 (d, 2H, Ar—H), 7.19 (t, 4H, Ar—H), 7.32 (d, 2H, Ar—H), 7.57 (s, 2H, NH—Ar), 7.63 (s, 2H, Ar—H), 7.68 (t, 1H, Ar—H), 8.08 (d, 2H, Ar—H), 8.52 (s, 1H, Ar—H), 9.99 (s, 2H, NHCO)

Logarithmic viscosity: 0.43 dL/g (NMP solution at a concentration of 0.5 g/dL, measured at 30° C.)

GPC: $M_n$=17000, $M_w$=27000, $M_w/M_n$=1.6 Solubility: 20 wt % dissolved in NMP, DMAc, DMF, DMSO, THF, and acetone The polyamide was dissolved in DMAc to provide a polymer solution at a concentration of 20 wt %. This polymer solution was cast on a glass plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible, colorless and transparent polyamide film (23 μm) was produced. This film was used to evaluate the thermal properties and optical properties.

Thermal Properties

Glass transition temperature: 259° C. (TMA)

Weight loss by dehydration: 4.5% weight loss from 300° C. (theoretical value: 5.5%)

Optical Properties

Cut-off wavelength: 346 nm

Light transmittance at 500 nm: 80% d-Line refractive index ($n_d$): 1.634 (in-plane), 1.634 (out-of-plane)

Average refractive index ($n_{ave}$): 1.634

Permittivity (ε): 2.94

Example 4

Synthesis of Polyamide (PA (TPBT-PhTA))

[Chem. 31]

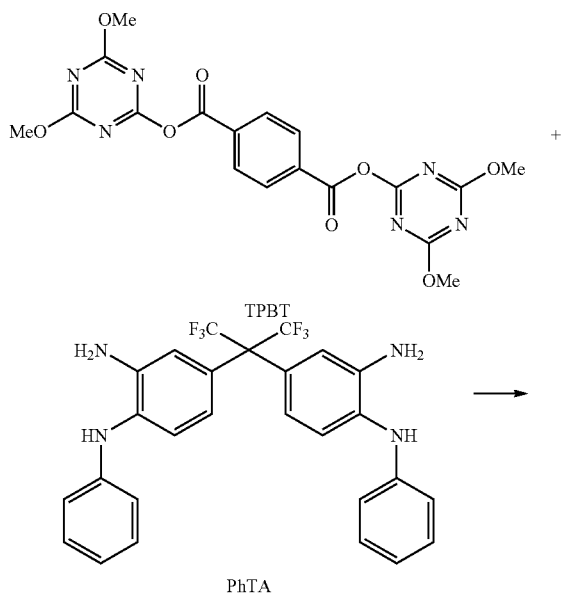

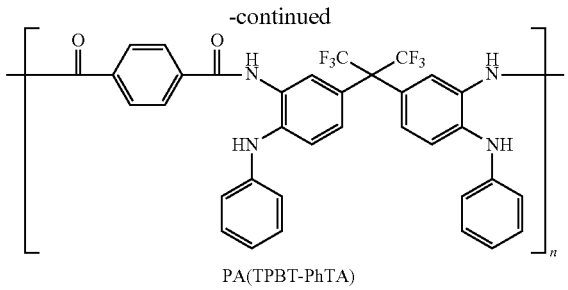

PA(TPBT-PhTA)

A 100 mL three-neck flask equipped with a stirrer, a thermometer, and a nitrogen inlet tube was dried with a heat gun under a nitrogen stream, and then charged with 1.290 g (2.50 mmol) of 2,2-bis(3-amino-4-anilinophenyl)hexafluoropropane (PhTA) and 5 mL of NMP. These components were completely dissolved. Thereto was added 1.111 g (2.50 mmol) of a triazine-based active diester (TPBT), and the components were allowed to react at 40° C. for six hours.

After completion of the reaction, the reaction solution was put into 500 mL of methanol so that a polymer precipitate was obtained. The polymer precipitate was collected by suction filtration and dried under reduced pressure at room temperature for 12 hours. The crude yield was 93%. The dry polymer was dissolved in NMP, and then purified by reprecipitation in methanol, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery pale yellow PA (TPBT-PhTA) (actual yield: 1.29 g, percent yield: 80%) was obtained. ¹H-NMR was performed to confirm generation of the polyamide.

The physical properties of this polyamide were determined. The results are shown below.

FT-IR (film, cm⁻¹): 1665 (C=O), 1598 (C=C), 1498 (C=C), 1171 (C—F)

¹H-NMR (DMSO-d₆, ppm): 6.87 (t, 2H, Ar—H), 7.03 (d, 4H, Ar—H), 7.10 (s, 2H, Ar—H), 7.23 (t, 4H, Ar—H), 7.34 (d, 2H, Ar—H), 7.67 (s, 2H, NH—Ar), 7.76 (s, 2H, Ar—H), 8.01 (s, 4H, Ar—H), 9.95 (s, 2H, NHCO)

Logarithmic viscosity: 0.32 dL/g (NMP solution at a concentration of 0.5 g/dL, measured at 30° C.)

GPC: $M_n$=24000, $M_w$=38000, $M_w/M_n$=1.6

Solubility: 20 wt % dissolved in NMP, DMAc, DMF, DMSO, THF, and acetone

The polyamide was dissolved in DMAc to provide a polymer solution at a concentration of 20 wt %. This polymer solution was cast on a glass plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible, transparent polyamide film (22 μm) was produced. This film was used to evaluate the thermal properties and optical properties.

Thermal Properties

Glass transition temperature: 280° C. (TMA)

Weight loss by dehydrocyclization: 4.9% weight loss from 280° C. (theoretical value: 5.6%)

Optical Properties

Cut-off wavelength: 312 nm

Light transmittance at 500 nm: 83% d-Line refractive index ($n_d$): 1.642 (in-plane), 1.640 (out-of-plane)

Average refractive index ($n_{ave}$): 1.641

Permittivity (ε): 2.96

Example 5

Synthesis of Polyamide (PA (DCPT-PhTA))

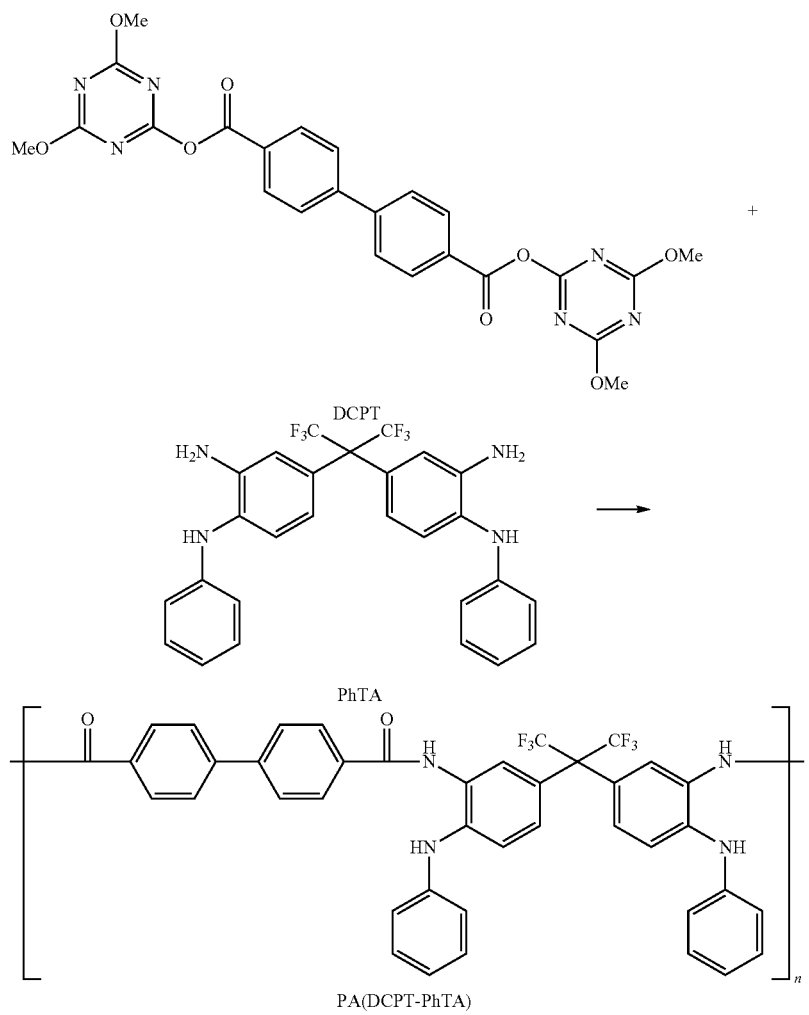

A 100 mL three-neck flask equipped with a stirrer and a nitrogen inlet tube was dried with a heat gun under a nitrogen stream, and then charged with 1.290 g (2.50 mmol) of 2,2-bis(3-amino-4-anilinophenyl)hexafluoropropane (PhTA) and 5 mL of NMP. These components were completely dissolved. Thereto was added 1.301 g (2.50 mmol) of a triazine-based active diester (DCPT), and the components were allowed to react at 10° C. for six hours.

After completion of the reaction, the reaction solution was put into 500 mL of methanol so that a polymer precipitate was obtained. The polymer precipitate was collected by suction filtration and dried under reduced pressure at room temperature for 12 hours. The crude yield was 90%. The dry polymer was dissolved in NMP, and then purified by reprecipitation in methanol, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery pale yellow PA (DCPT-PhTA) (actual yield: 1.46 g, percent yield: 81%) was obtained. $^1$H-NMR was performed to confirm generation of the polyamide.

The physical properties of this polyamide were determined. The results are shown below.

FT-IR (film, cm$^{-1}$): 1666 (C=O), 1600 (C=C), 1498 (C=C), 1170 (C—F)

$^1$H-NMR (DMSO-d$_6$, ppm): 6.88 (t, 2H, Ar—H), 7.06 (d, 4H, Ar—H), 7.12 (d, 2H, Ar—H), 7.25 (t, 4H, Ar—H), 7.36 (d, 2H, Ar—H), 7.70 (s, 2H, NH), 7.75 (s, 2H, Ar—H), 7.88 (d, 4H, Ar—H), 8.06 (d, 4H, Ar—H), 9.91 (s, 2H, NHCO)

Logarithmic viscosity: 0.28 dL/g (NMP solution at a concentration of 0.5 g/dL, measured at 30° C.)

GPC: $M_n$=30000, $M_w$=48000, $M_w/M_n$=1.6

Solubility: 20 wt % dissolved in NMP, DMAc, DMF, DMSO, THF, and acetone

The polyamide was dissolved in DMAc to provide a polymer solution at a concentration of 20 wt %. This polymer solution was cast on a glass plate and dried in a desiccator at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible pale yellow polyamide film (28 μm) was produced. This film was used to evaluate the thermal properties and optical properties.

Thermal Properties
  Glass transition temperature: 267° C. (TMA)
  Weight loss by dehydrocyclization: 4.9% weight loss from 280° C. (theoretical value: 5.0%)
  Coefficient of thermal expansion: 68 ppm/° C. (150° C. to 200° C.)

Optical Properties
  Cut-off wavelength: 365 nm
  Light transmittance at 500 nm: 81%
  d-Line refractive index ($n_d$): 1.660 (in-plane), 1.653 (out-of-plane)
  Average refractive index ($n_{ave}$): 1.655 Permittivity (ε): 3.01

Example 6

Synthesis of Polyamide (PA (HPBT-PhTA))

[Chem. 33]

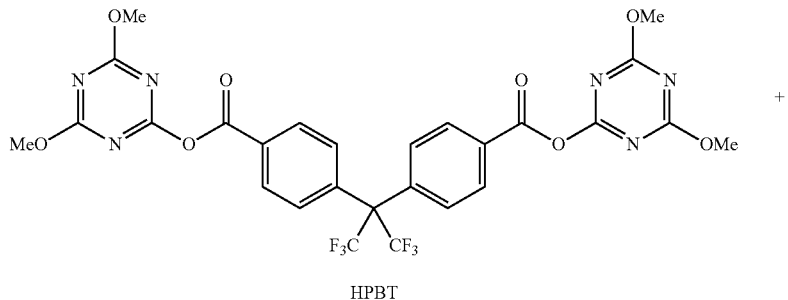

HPBT

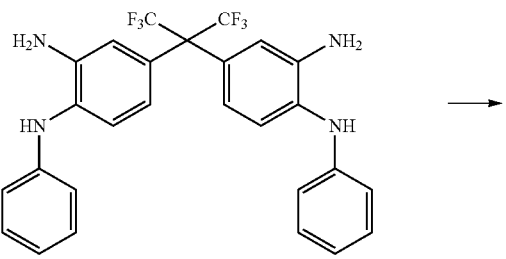

PhTA

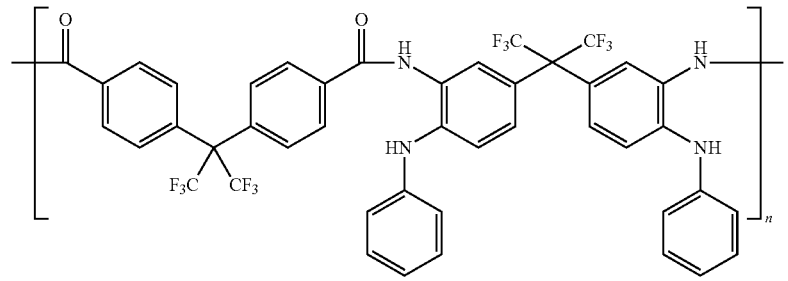

PA(HPBT-PhTA)

A 100 mL three-neck flask equipped with a stirrer and a nitrogen inlet tube was dried with a heat gun under a nitrogen stream, and then charged with 1.290 g (2.50 mmol) of 2,2-bis(3-amino-4-anilinophenyl)hexafluoropropane (PhTA) and 5 mL of NMP. These components were completely dissolved. Thereto was added 1.668 g (2.50 mmol) of a triazine-based active diester (HPBT), and the components were allowed to react at 10° C. for six hours.

After completion of the reaction, the reaction solution was put into 500 mL of methanol so that a polymer precipitate was obtained. The polymer precipitate was collected by suction filtration and dried under reduced pressure at room temperature for 12 hours. The crude yield was 99%. The dry polymer was dissolved in NMP, and then purified by reprecipitation in methanol, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery pale yellow PA (HPBT-PhTA) (actual yield: 1.83 g, percent yield: 85%) was obtained. $^1$H-NMR was performed to confirm generation of the polyamide.

The physical properties of this polyamide were determined. The results are shown below.

FT-IR (film, cm$^{-1}$): 1658 (C=O), 1493 (C=C), 1176 (C—F)

$^1$H-NMR (DMSO-d$_6$, ppm): 6.86 (t, 2H, Ar—H), 7.04 (d, 4H, Ar—H), 7.09 (d, 2H, Ar—H), 7.22 (t, 4H, Ar—H), 7.32 (d, 2H, Ar—H), 7.42 (d, 4H, Ar—H), 7.57 (s, 2H, Ar—H), 7.72 (s, 2H, NH), 8.04 (d, 4H, Ar—H), 9.99 (s, 2H, NHCO)

Logarithmic viscosity: 0.16 dL/g (NMP solution at a concentration of 0.5 g/dL, measured at 30° C.)

GPC: M$_n$=8000, M$_w$=13000, M$_w$/M$_n$=1.6

Solubility: 20 wt % dissolved in NMP, DMAc, DMF, DMSO, THF, and acetone

The polyamide was dissolved in DMAc to provide a polymer solution at a concentration of 20 wt %. This polymer solution was cast on a quartz plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a colorless and transparent polyamide film (7 μm) was produced. This film was used to evaluate the thermal properties and optical properties.

Thermal Properties

Glass transition temperature: 174° C. (DSC)

Weight loss by dehydrocyclization: 4.0% weight loss from 280° C. (theoretical value: 4.1%)

Optical Properties

Cut-off wavelength: 363 nm

Light transmittance at 500 nm: 81% d-Line refractive index (n$_d$): 1.586 (in-plane), 1.586 (out-of-plane)

Average refractive index (n$_{ave}$): 1.586

Permittivity (ε): 2.77

Example 7

Synthesis of Polyamide (PA (OBBT-TA))

[Chem. 34]

A 100 mL three-neck flask equipped with a stirrer, a thermometer, and a nitrogen inlet tube was charged with 0.162 g (5 wt % relative to NMP) of lithium chloride, dried with a heat gun under a nitrogen stream, and then charged with 3 mL of NMP. These components were completely dissolved. Next, 0.910 g (2.50 mmol) of 2,2-bis(3,4-diaminophenyl)hexafluoropropane (TA) was added thereto and dissolved therein. Thereto was added 1.340 g (2.50 mmol) of a triazine-based active diester (OBBT) completely dissolved in 4 mL (5 wt % LiCl) of NMP while the system was cooled down to 0° C., and the components were allowed to react at 0° C. for 16 hours.

After completion of the reaction, the reaction solution was put into 500 mL of methanol so that a polymer precipitate was obtained. The polymer precipitate was collected by suction filtration and dried under reduced pressure at room temperature for 12 hours. The crude yield was 99%. The dry polymer was dissolved in NMP, and then purified by reprecipitation in methanol, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery pale yellow PA (OBBT-TA) (actual yield: 0.58 g, percent yield: 38%) was obtained. $^1$H-NMR was performed to confirm generation of the polyamide.

The physical properties of this polyamide were determined. The results are shown below.

FT-IR (film, cm$^{-1}$): 1652 (C=O), 1596 (C=C), 1490 (C=C), 1247 (C—O—C), 1169 (C—F)

$^1$H-NMR (DMSO-d$_6$, ppm): 5.26 (s, 4H, NH$_2$), 6.80 (d, 2H, Ar—H), 6.89 (s, 2H, Ar—H), 7.16 (d, 4H, Ar—H), 7.25 (s, 2H, Ar—H), 8.05 (d, 4H, Ar—H), 9.71 (d, 2H, NHCO)

Logarithmic viscosity: 0.47 dL/g (NMP solution at a concentration of 0.5 g/dL, measured at 30° C.)

GPC: M$_n$=25000, M$_w$=50000, M$_w$/M$_n$=2.0

Solubility: 20 wt % dissolved in NMP, DMAc, DMF, DMSO, THF, and acetone

The polyamide was dissolved in DMAc to provide a polymer solution at a concentration of 20 wt %. This polymer solution was cast on a glass plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible, colorless and transparent polyamide film (20 μm) was produced. This film was used to evaluate the thermal properties and optical properties.

Thermal Properties
  Glass transition temperature: 256° C. (TMA)
  Weight loss by dehydrocyclization: 5.5% weight loss from 300° C. (theoretical value: 6.0%)
Optical Properties
  Cut-off wavelength: 349 nm
  Light transmittance at 500 nm: 81%
  d-Line refractive index (n$_d$): 1.643 (in-plane), 1.621 (out-of-plane)
  Average refractive index (n$_{ave}$): 1.628
  Permittivity (ε): 2.92

Example 8

Synthesis of Polyamide (PA (IPBT-TA))

[Chem. 35]

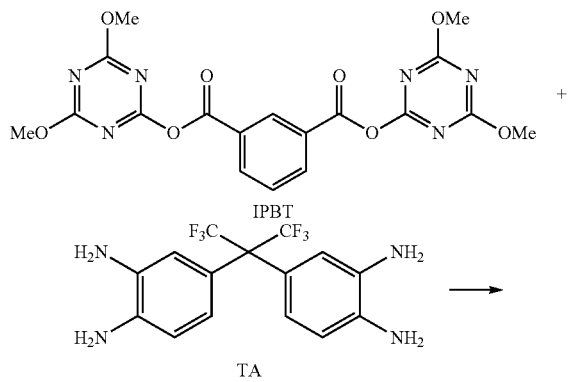

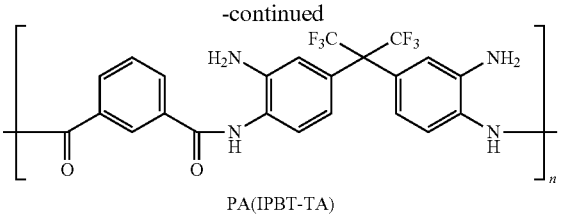

PA(IPBT-TA)

A 100 mL three-neck flask equipped with a stirrer, a thermometer, and a nitrogen inlet tube was charged with 0.542 g (5 wt % relative to NMP) of lithium chloride, dried with a heat gun under a nitrogen stream, and then charged with 10 mL of NMP. These components were completely dissolved. Next, 0.911 g (2.50 mmol) of 2,2-bis(3,4-diaminophenyl)hexafluoropropane (TA) was added thereto and dissolved therein. Thereto was added 1.111 g (2.50 mmol) of a triazine-based active diester (IPBT) and the components were allowed to react at 50° C. for 24 hours.

After completion of the reaction, the reaction solution was put into 500 mL of distilled water so that a polymer precipitate was obtained. The polymer precipitate was collected by suction filtration and dried under reduced pressure at room temperature for 12 hours. The crude yield was 91%. The dry polymer was dissolved in NMP, and then purified by reprecipitation in distilled water, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery pale yellow PA (IPBT-TA) (actual yield: 0.80 g, percent yield: 69%) was obtained. $^1$H-NMR was performed to confirm generation of the polyamide.

The physical properties of this polyamide were determined. The results are shown below.

FT-IR (film, cm$^{-1}$): 1657 (C=O), 1497 (C=C), 1168 (C—F)

$^1$H-NMR (DMSO-d$_6$, ppm): 5.32 (s, 4H, NH$_2$), 6.80 (d, 2H, Ar—H), 6.91 (d, 2H, Ar—H), 7.30 (s, 2H, Ar—H), 7.62 (d, 1H, Ar—H), 8.12 (d, 2H, Ar—H), 8.55 (s, 1H, Ar—H), 9.87 (d, 2H, NHCO)

Logarithmic viscosity: 0.44 dL/g (NMP solution at a concentration of 0.5 g/dL, measured at 30° C.)

GPC: M$_n$=28000, M$_w$=50000, M$_w$/M$_n$=1.8

Solubility: 20 wt % dissolved in NMP, DMAc, DMF, DMSO, THF, and acetone

The polyamide was dissolved in DMAc to provide a polymer solution at a concentration of 20 wt %. This polymer solution was cast on a glass plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible, colorless and transparent polyamide film (20 μm) was produced. This film was used to evaluate the thermal properties and optical properties.

Thermal Properties
  Glass transition temperature: 255° C. (DSC)
  Weight loss by dehydrocyclization: 5.6% weight loss from 300° C. (theoretical value: 6.0%)
Optical Properties
  Cut-off wavelength: 349 nm
  Light transmittance at 500 nm: 79%
  d-Line refractive index (n$_d$): 1.638 (in-plane), 1.632 (out-of-plane)
  Average refractive index (n$_{ave}$): 1.634
  Permittivity (ε): 2.94

Example 9

Synthesis of Polyamide (PA (TPBT-TA))

[Chem. 36]

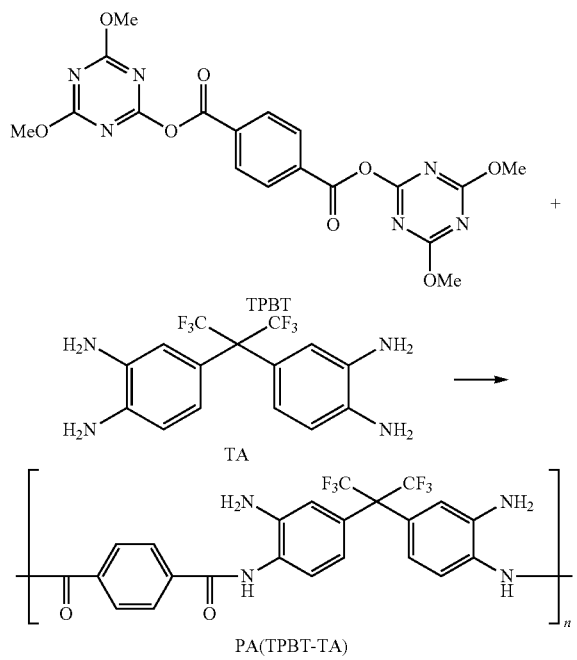

A 100 mL three-neck flask equipped with a stirrer and a nitrogen inlet tube was charged with 0.542 g (5 wt % relative to NMP) of lithium chloride, dried with a heat gun under a nitrogen stream, and then charged with 10 mL of NMP. These components were completely dissolved. Next, 0.911 g (2.50 mmol) of 2,2-bis(3,4-diaminophenyl)hexafluoropropane (TA) was added thereto and dissolved therein. Thereto was added 1.111 g (2.50 mmol) of a triazine-based active diester (TPBT) while the system was cooled down to −10° C., and the components were allowed to react at −10° C. for 24 hours.

After completion of the reaction, the reaction solution was put into 500 mL of distilled water so that a polymer precipitate was obtained. The polymer precipitate was collected by suction filtration and dried under reduced pressure at room temperature for 12 hours. The crude yield was 99%. The dry polymer was dissolved in NMP, and then purified by reprecipitation in distilled water, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery pale yellow PA (TPBT-TA) (actual yield: 1.09 g, percent yield: 88%) was obtained. $^1$H-NMR was performed to confirm generation of the polyamide.

The physical properties of this polyamide were determined. The results are shown below.

FT-IR (film, cm$^{-1}$): 1658 (C=O), 1500 (C=C), 1170 (C—F)

$^1$H-NMR (DMSO-d$_6$, ppm): 5.34 (s, 4H, NH$_2$), 6.81 (d, 2H, Ar—H), 6.89 (d, 2H, Ar—H), 7.28 (s, 2H, Ar—H), 8.05 (d, 4H, Ar—H), 9.88 (s, 2H, NHCO)

Logarithmic viscosity: 0.45 dL/g (NMP solution at a concentration of 0.5 g/dL, measured at 30° C.)

GPC: $M_n$=19000, $M_w$=42000, $M_w/M_n$=2.2

Solubility: 20 wt % dissolved in NMP, DMAc, DMF, DMSO, THF, and acetone

The polyamide was dissolved in DMAc to provide a polymer solution at a concentration of 20 wt %. This polymer solution was cast on a glass plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible, colorless and transparent polyamide film (27 μm) was produced. This film was used to evaluate the thermal properties and optical properties.

Thermal Properties
  Glass transition temperature: 210° C. (DMA)
  Weight loss by dehydrocyclization: 7.2% weight loss from 280° C. (theoretical value: 7.3%)

Optical Properties
  Cut-off wavelength: 382 nm
  Light transmittance at 500 nm: 79%
  d-Line refractive index ($n_d$): 1.663 (in-plane), 1.632 (out-of-plane)
  Average refractive index ($n_{ave}$): 1.642
  Permittivity (ε): 2.97

Example 10

Synthesis of Polyamide (PA (DCPT-TA))

[Chem. 37]

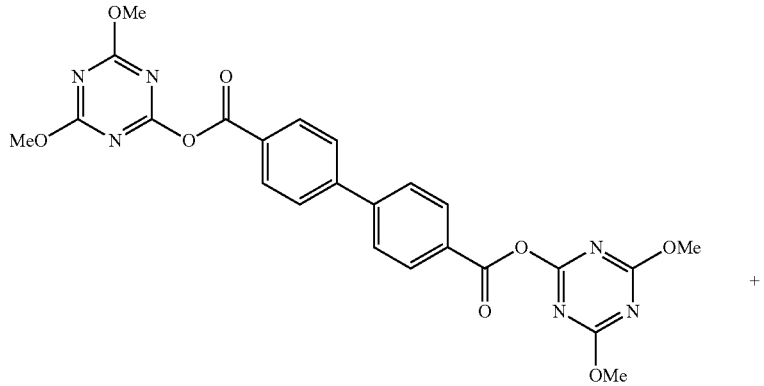

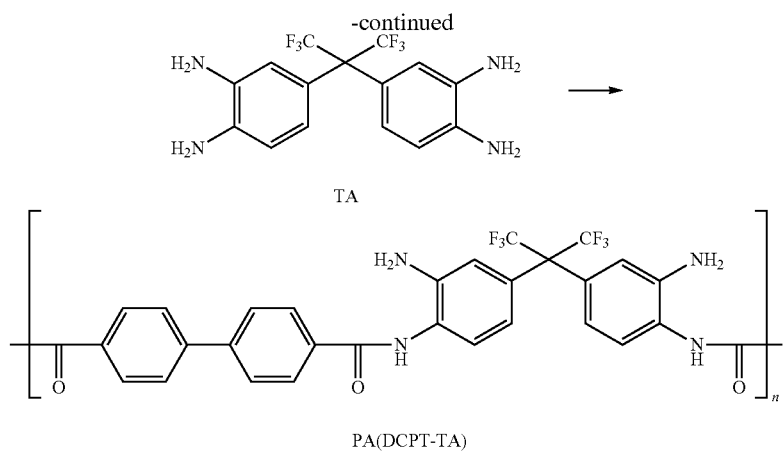

TA

PA(DCPT-TA)

A 100 mL three-neck flask equipped with a stirrer and a nitrogen inlet tube was charged with 0.542 g (5 wt % relative to NMP) of lithium chloride, dried with a heat gun under a nitrogen stream, and then charged with 10 mL of NMP. These components were completely dissolved. Next, 0.911 g (2.50 mmol) of 2,2-bis(3,4-diaminophenyl)hexafluoropropane (TA) was added thereto and dissolved therein. Thereto was added 1.301 g (2.50 mmol) of a triazine-based active diester (DCPT) while the system was cooled down to 0° C., and the components were allowed to react at 0° C. for 24 hours.

After completion of the reaction, the reaction solution was put into 500 mL of distilled water so that a polymer precipitate was obtained. The polymer precipitate was collected by suction filtration and dried under reduced pressure at room temperature for 12 hours. The crude yield was 99%. The dry polymer was dissolved in NMP, and then purified by reprecipitation in distilled water, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery pale yellow PA (DCPT-TA) (actual yield: 1.32 g, percent yield: 88%) was obtained. $^1$H-NMR was performed to confirm generation of the polyamide.

The physical properties of this polyamide were determined. The results are shown below.

FT-IR (film, cm$^{-1}$): 1657 (C=O), 1500 (C=C), 1170 (C—F)

$^1$H-NMR (DMSO-d$_6$, ppm): 5.30 (s, 4H, NH$_2$), 6.82 (d, 2H, Ar—H), 6.90 (d, 2H, Ar—H), 7.33 (s, 2H, Ar—H), 7.90 (d, 4H, Ar—H), 8.10 (d, 4H, Ar—H), 9.83 (s, 2H, NHCO)

Logarithmic viscosity: 0.42 dL/g (NMP solution at a concentration of 0.5 g/dL, measured at 30° C.)

GPC: $M_n$=17000, $M_w$=34000, $M_w/M_n$=2.0

Solubility: 20 wt % dissolved in NMP, DMAc, DMF, DMSO, THF, and acetone

The polyamide was dissolved in DMAc to provide a polymer solution at a concentration of 20 wt %. This polymer solution was cast on a glass plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible, colorless and transparent polyamide film (8 μm) was produced.

This film was used to evaluate the thermal properties and optical properties.

Thermal Properties

Glass transition temperature: 263° C. (DMA)

Weight loss by dehydrocyclization: 6.0% weight loss from 280° C. (theoretical value: 6.0%)

Optical Properties

Cut-off wavelength: 379 nm

Light transmittance at 500 nm: 78% d-Line refractive index ($n_d$): 1.680 (in-plane), 1.628 (out-of-plane)

Average refractive index ($n_{ave}$): 1.645

Permittivity (ε): 2.98

Example 11

Synthesis of Polyamide (PA (HPBT-TA))

[Chem. 38]

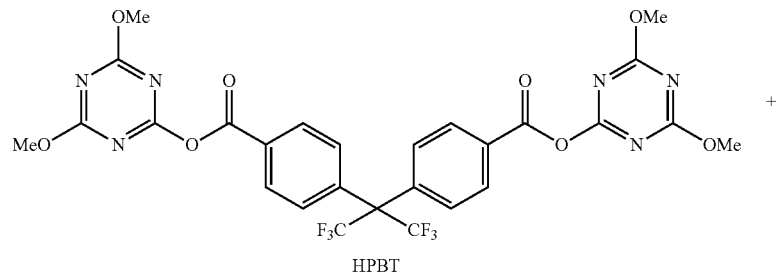

HPBT

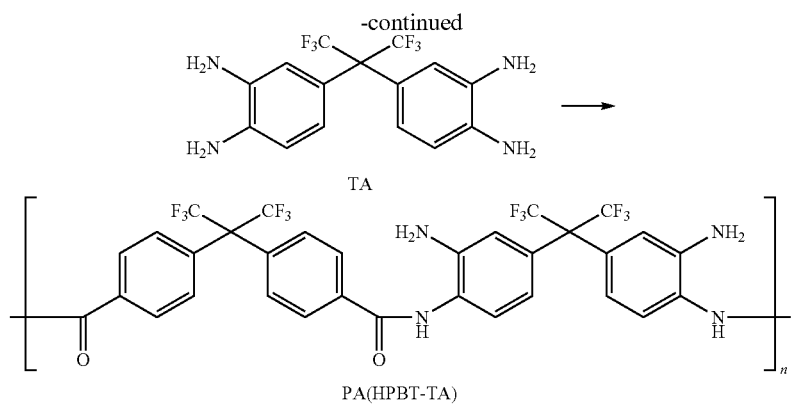

PA(HPBT-TA)

A 100 mL three-neck flask equipped with a stirrer and a nitrogen inlet tube was charged with 0.271 g (5 wt % relative to NMP) of lithium chloride, dried with a heat gun under a nitrogen stream, and then charged with 5 mL of NMP. These components were completely dissolved. Next, 0.911 g (2.50 mmol) of 2,2-bis(3,4-diaminophenyl)hexafluoropropane (TA) was added thereto and dissolved therein. Thereto was added 1.676 g (2.50 mmol) of a triazine-based active diester (HPBT) and the components were allowed to react at room temperature for 16 hours.

After completion of the reaction, the reaction solution was put into 500 mL of distilled water so that a polymer precipitate was obtained. The polymer precipitate was collected by suction filtration and dried under reduced pressure at room temperature for 12 hours. The crude yield was 77%. The dry polymer was dissolved in NMP, and then purified by reprecipitation in distilled water, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery pale yellow PA (HPBT-TA) (actual yield: 1.15 g, percent yield: 64%) was obtained. $^1$H-NMR was performed to confirm generation of the polyamide.

The physical properties of this polyamide were determined. The results are shown below.

FT-IR (film, cm$^{-1}$): 1647 (C=O), 1599 (C=C), 1498 (C=C), 1177 (C—F)

$^1$H-NMR (DMSO-d$_6$, ppm): 5.34 (s, 4H, NH$_2$), 6.78 (d, 2H, Ar—H), 6.90 (d, 2H, Ar—H), 7.27 (s, 2H, Ar—H), 7.45 (d, 4H, Ar—H), 8.07 (d, 4H, Ar—H), 9.87 (s, 2H, NHCO)

GPC: $M_n$=4000, $M_w$=7000, $M_w/M_n$=1.8

Solubility: 20 wt % dissolved in NMP, DMAc, DMF, DMSO, THF, acetone, and methanol The polyamide was dissolved in DMAc to provide a polymer solution at a concentration of 20 wt %. This polymer solution was cast on a quartz plate and dried in a desiccator under reduced pressure at room temperature for six hours. The workpiece was dried in a vacuum oven at 60° C. for six hours, at 100° C. for six hours, at 150° C. for one hour, at 200° C. for one hour, and at 250° C. for one hour. Thereby, a colorless and transparent polyamide film (7 μm) was produced. This film was used to evaluate the thermal properties and optical properties.

Thermal Properties
 Glass transition temperature: 296° C. (DSC)
 Weight loss by dehydrocyclization: 4.9% weight loss from 280° C. (theoretical value: 5.0%)

Optical Properties
 Cut-off wavelength: 339 nm
 Light transmittance at 500 nm: 85%
 d-Line refractive index ($n_d$): 1.574 (in-plane), 1.564 (out-of-plane)
 Average refractive index ($n_{ave}$): 1.567
 Permittivity (ε): 2.70

Comparative Example 1

Synthesis of Polyamide (PA (OBBT-DAB))

[Chem. 39]

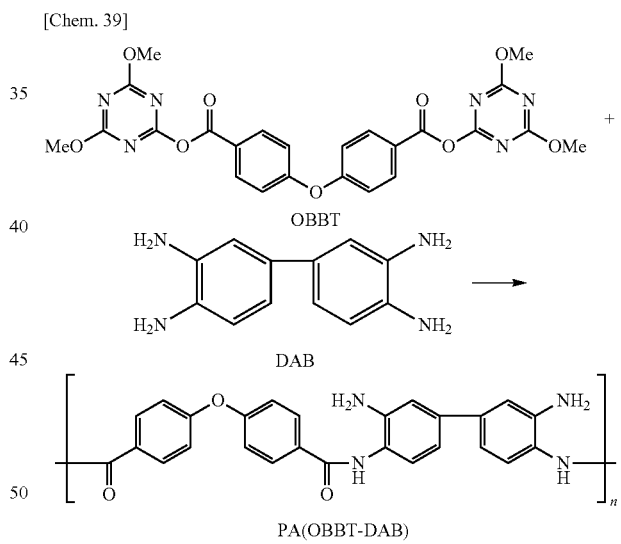

PA(OBBT-DAB)

A 100 mL three-neck flask equipped with a stirrer, a thermometer, and a nitrogen inlet tube was charged with 0.162 g (5 wt % relative to NMP) of lithium chloride, dried with a heat gun under a nitrogen stream, and then charged with 3 mL of NMP. These components were completely dissolved. Next, 0.536 g (2.50 mmol) of 3,3'-diaminobenzidine (DAB) was added thereto and dissolved therein. Thereto was added 1.341 g (2.50 mmol) of a triazine-based active diester (OBBT) completely dissolved in 4 mL (5 wt % LiCl) of NMP while the system was cooled down to 0° C., and the components were allowed to react at 0° C. for 16 hours.

After completion of the reaction, the reaction solution was put into 500 mL of methanol so that a polymer precipitate was obtained. The polymer precipitate was collected by suction filtration and dried under reduced pressure at room temperature for 12 hours. The crude yield was 89%. The dry polymer was dissolved in NMP, and then purified by reprecipitation in methanol, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery brown PA (OBBT-DAB) (actual yield: 0.67 g, percent yield: 61%) was obtained. $^1$H-NMR was performed to confirm generation of the polyamide.

The physical properties of this polyamide were determined. The results are shown below.

FT-IR (film, cm$^{-1}$): 1653 (C=O), 1508 (C=C), 1247 (C—O—C)

$^1$H-NMR (DMSO-d$_6$, ppm): 5.07 (s, 4H, NH$_2$), 7.03 (d, 2H, Ar—H), 7.05 (d, 2H, Ar—H), 7.48 (s, 2H, Ar—H), 7.48 (d, 4H, Ar—H), 8.10 (d, 4H, Ar—H), 9.75 (s, 2H, NHCO)

Logarithmic viscosity: 0.35 dL/g (NMP solution at a concentration of 0.5 g/dL, measured at 30° C.)

GPC: $M_n$=23000, $M_w$=53000, $M_w/M_n$=2.3

Solubility: 20 wt % dissolved in NMP, DMAc, DMF, and DMSO

The polyamide was dissolved in DMAc to provide a polymer solution at a concentration of 20 wt %. This polymer solution was cast on a glass plate and dried in a desiccator at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible brown polyamide film (16 μm) was produced. This film was used to evaluate the thermal properties and optical properties.

Thermal Properties
  Glass transition temperature: 248° C. (TMA)
  Weight loss by dehydrocyclization: 8.0% weight loss from 300° C. (theoretical value: 8.2%)
Optical Properties
  Cut-off wavelength: 391 nm
  Light transmittance at 500 nm: 58%
  d-Line refractive index ($n_d$): 1.811 (in-plane), 1.718 (out-of-plane)
  Average refractive index ($n_{ave}$): 1.749
  Permittivity (ε): 3.36

Comparative Example 2

Synthesis of Polyamide (PA (IPBT-DAB))

[Chem. 40]

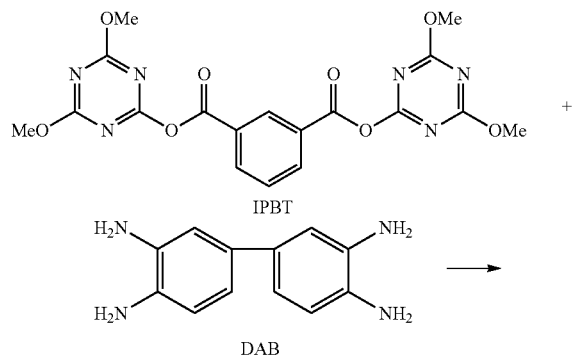

-continued

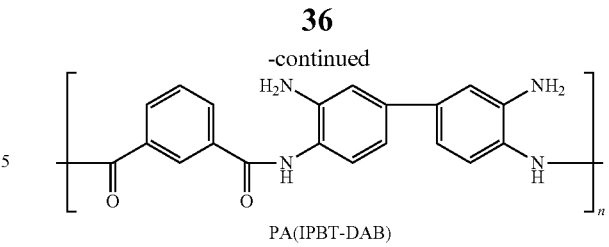

PA(IPBT-DAB)

A 100 mL three-neck flask equipped with a stirrer, a thermometer, and a nitrogen inlet tube was charged with 0.650 g (5 wt % relative to NMP) of lithium chloride, dried with a heat gun under a nitrogen stream, and then charged with 12 mL of NMP. These components were completely dissolved. Next, 0.536 g (2.50 mmol) of 3,3'-diaminobenzidine (DAB) was added thereto and dissolved therein. Thereto was added 1.110 g (2.50 mmol) of a triazine-based active diester (IPBT) and the components were allowed to react at room temperature for 24 hours.

After completion of the reaction, the reaction solution was put into 500 mL of methanol so that a polymer precipitate was obtained. The polymer precipitate was collected by suction filtration and dried under reduced pressure at room temperature for 12 hours. The crude yield was 99%. The dry polymer was dissolved in NMP, and then purified by reprecipitation in methanol, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery brown PA (IPBT-DAB) (actual yield: 0.72 g, percent yield: 84%) was obtained. $^1$H-NMR was performed to confirm generation of the polyamide.

The physical properties of this polyamide were determined. The results are shown below.

FT-IR (film, cm$^{-1}$): 1652 (C=O), 1510 (C=C)

$^1$H-NMR (DMSO-d$_6$, ppm): 5.12 (s, 4H, NH$_2$), 6.86 (d, 2H, Ar—H), 7.05 (d, 2H, Ar—H), 7.30 (d, 2H, Ar—H), 7.67 (t, 1H, Ar—H), 8.19 (s, 2H, Ar—H), 8.64 (s, 1H, Ar—H), 9.86 (s, 2H, NHCO)

Logarithmic viscosity: 0.78 dL/g (NMP solution at a concentration of 0.5 g/dL, measured at 30° C.)

GPC: $M_n$=36000, $M_w$=57000, $M_w/M_n$=1.6

Solubility: 20 wt % dissolved in NMP, DMAc, DMF, and DMSO

The polyamide was dissolved in DMAc to provide a polymer solution at a concentration of 20 wt %. This polymer solution was cast on a glass plate and dried in a desiccator at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible brown polyamide film (17 μm) was produced. This film was used to evaluate the thermal properties and optical properties.

Thermal Properties
  Glass transition temperature: 255° C. (DSC)
  Weight loss by dehydrocyclization: 8.9% weight loss from 300° C. (theoretical value: 9.0%)
Optical Properties
  Cut-off wavelength: 384 nm
  Light transmittance at 500 nm: 73%
  d-Line refractive index ($n_d$): 1.780 (in-plane), 1.686 (out-of-plane)
  Average refractive index ($n_{ave}$): 1.717
  Permittivity (ε): 3.24

Comparative Example 3

Synthesis of Polyamide (PA (TPBT-DAB))

[Chem. 41]

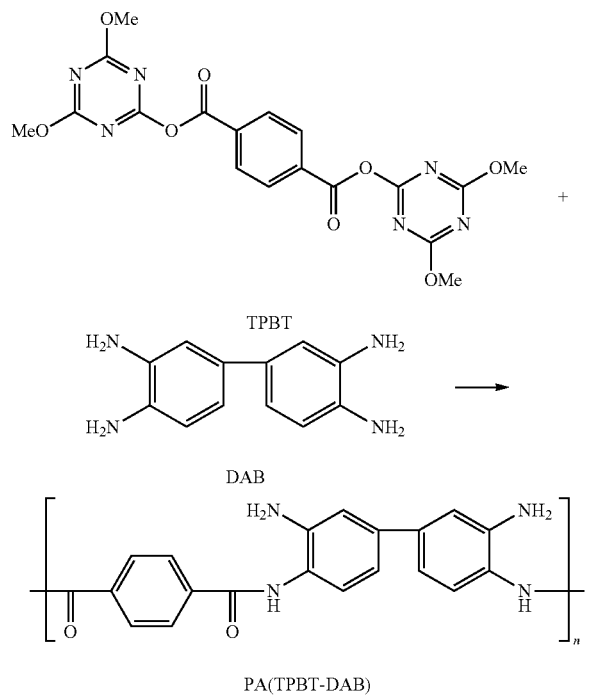

PA(TPBT-DAB)

A 100 mL three-neck flask equipped with a stirrer and a nitrogen inlet tube was charged with 0.812 g (5 wt % relative to NMP) of lithium chloride, dried with a heat gun under a nitrogen stream, and then charged with 15 mL of NMP. These components were completely dissolved. Next, 0.536 g (2.50 mmol) of 3,3-diaminobenzidine (DAB) was added thereto and dissolved therein. The system was cooled down to −10° C. Thereto was added 1.111 g (2.50 mmol) of a triazine-based active diester (TPBT), and the components were allowed to react at −10° C. for 24 hours.

After completion of the reaction, the reaction solution was put into 500 mL of methanol so that a polymer precipitate was obtained. The polymer precipitate was collected by suction filtration and dried under reduced pressure at room temperature for 12 hours. The crude yield was 91%. The dry polymer was dissolved in NMP, and then purified by reprecipitation in methanol, whereby 2-hydroxy-4,6-dimethoxy-1,3,5-triazine as a leaving component was removed. The polymer precipitate was collected by suction filtration and dried under reduced pressure at room temperature for 12 hours. Thereby, a powdery yellow PA (TPBT-DAB) (actual yield: 0.66 g, percent yield: 77%) was obtained. $^1$H-NMR was performed to confirm generation of the polyamide.

The physical properties of this polyamide were determined. The results are shown below.

FT-IR (film, cm$^{-1}$): 1658 (C=O), 1510 (C=C)

$^1$H-NMR (DMSO-$d_6$, ppm): 5.05 (s, 4H, NH$_2$), 6.85 (d, 2H, Ar—H), 7.07 (d, 2H, Ar—H), 7.30 (s, 2H, Ar—H), 8.15 (d, 4H, Ar—H), 9.86 (s, 2H, NHCO)

Logarithmic viscosity: 1.02 dL/g (NMP solution at a concentration of 0.5 g/dL, measured at 30° C.)

GPC: $M_n$=31000, $M_w$=71000, $M_w/M_n$=2.3

Solubility: 20 wt % dissolved in NMP, DMAc, DMF, and DMSO

The polyamide was dissolved in DMAc to provide a polymer solution at a concentration of 20 wt %. This polymer solution was cast on a glass plate and dried in a desiccator at room temperature for six hours. The workpiece was dried in a vacuum oven at 60° C. for six hours, at 100° C. for six hours, at 150° C. for one hour, at 200° C. for one hour, and at 250° C. for one hour. Thereby, a flexible yellow polyamide film (8 μm) was produced. This film was used to evaluate the thermal properties and optical properties.

Thermal Properties
  Glass transition temperature: 251° C. (TMA)
  Weight loss by dehydrocyclization: 9.7% weight loss from 280° C. (theoretical value: 10.5%)
Optical Properties
  Cut-off wavelength: 433 nm
  Light transmittance at 500 nm: 60%
  d-Line refractive index ($n_d$): 1.900 (in-plane), 1.703 (out-of-plane)
  Average refractive index ($n_{ave}$): 1.769
  Permittivity (ε): 3.44

As described above, the polybenzimidazole precursor polyamides of the respective examples exhibited high solubility in solvents such as NMP and DMAc. The polyamide films each had a cut-off wavelength of 333 to 382 nm, which indicates excellent transparency. The refractive indexes thereof were 1.567 to 1.655 and the permittivities thereof were as low as 2.70 to 3.01.

Synthesis of Polybenzimidazole

Example 12

Synthesis of Polybenzimidazole (PBI (OBBT-PhTA))

[Chem. 42]

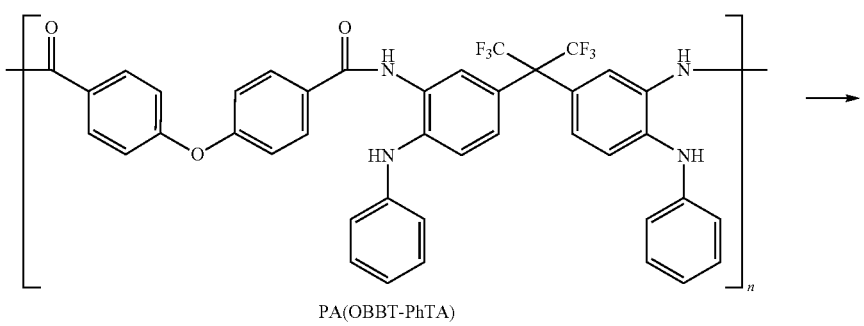

PA(OBBT-PhTA)

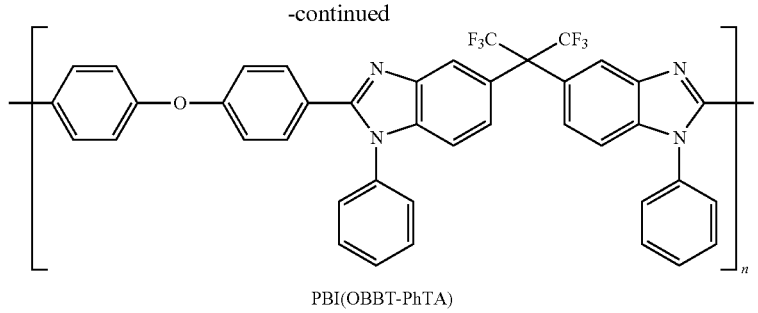

PBI(OBBT-PhTA)

Dry PA (OBBT-PhTA) was dissolved in DMAc to provide a polymer solution at a concentration of 20 wt %. This polymer solution was cast on a glass plate and dried in a desiccator under reduced pressure at room temperature for six hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 420° C. for 10 minutes. Thereby, a flexible, colorless and transparent polybenzimidazole film (38 μm) was produced. FT-IR and $^1$H-NMR were performed to confirm disappearance of amide bonds, progress of a dehydrocyclization reaction, and generation of a polybenzimidazole. The physical properties of this film are shown below.

FT-IR (film, cm$^{-1}$): 1600 (C=C), 1499 (C=C), 1443 (C=N), 1247 (C—O—C), 1173 (C—F)

$^1$H-NMR (CDCl3, ppm): 6.92 (d, 4H, Ar—H), 7.15 (d, 2H, Ar—H), 7.25 (d, 2H, Ar—H), 7.26 (d, 4H, Ar—H), 7.51 (t, 2H, Ar—H), 7.52 (t, 4H, Ar—H), 7.56 (d, 4H, Ar—H), 8.08 (s, 2H, Ar—H)

Logarithmic viscosity: 0.91 dL/g (NMP solution at a concentration of 0.5 g/dL, measured at 30° C.)

GPC: $M_n$=43000, $M_w$=151000, $M_w/M_n$=3.5

Solubility: 20 wt % dissolved in NMP, DMAc, DMF, THF, and chloroform

Mechanical Properties

Tensile strength at break: 88 MPa

Elongation at break: 6%

Initial tensile elasticity: 2.5 GPa

Thermal Properties

Glass transition temperature: 319° C. (TMA)

5% Weight loss temperature: 533° C. (in the air), 533° C. (in nitrogen)

10% Weight loss temperature: 551° C. (in the air), 550° C. (in nitrogen)

Carbonization yield: 72% (in nitrogen, 800° C.)

Coefficient of thermal expansion: 65 ppm/° C. (150° C. to 200° C.)

Optical Properties

Cut-off wavelength: 346 nm

Light transmittance at 500 nm: 81% d-Line refractive index ($n_d$): 1.641 (in-plane), 1.640 (out-of-plane)

Average refractive index ($n_{ave}$): 1.640

Permittivity (ε): 2.96

Example 13

Synthesis of Polybenzimidazole (PBI (IPBT-PhTA))

[Chem. 43]

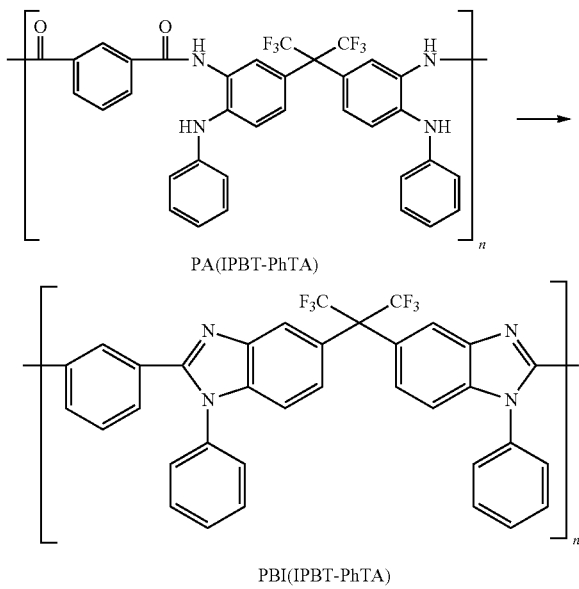

PA(IPBT-PhTA)

PBI(IPBT-PhTA)

Dry PA (IPBT-PhTA) was dissolved in DMAc to provide a polymer solution at a concentration of 20 wt %. This polymer solution was cast on a glass plate and dried in a desiccator under reduced pressure at room temperature for six hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 410° C. for 10 minutes. Thereby, a flexible, colorless and transparent polybenzimidazole film (27 μm) was produced. FT-IR and $^1$H-NMR were performed to confirm disappearance of amide bonds, progress of a dehydrocyclization reaction, and generation of a polybenzimidazole. The physical properties of this film are shown below.

FT-IR (film, cm$^{-1}$): 1597 (C=C), 1499 (C=C), 1443 (C=N), 1171 (C—F)

$^1$H-NMR (CDCl-d$_3$, ppm): 7.14 (t, 2H, Ar—H), 7.18 (t, 4H, Ar—H), 7.26 (d, 4H, Ar—H), 7.46 (m, 5H, Ar—H), 7.61 (d, 2H, Ar—H), 7.74 (s, 1H, Ar—H), 8.04 (s, 2H, Ar—H)

Logarithmic viscosity: 0.43 dL/g (NMP solution at a concentration of 0.5 g/dL, measured at 30° C.)

GPC: $M_n$=45000, $M_w$=122000, $M_w/M_n$=2.7

Solubility: 20 wt % dissolved in NMP, DMAc, DMF, THF, and chloroform

Mechanical Properties

Tensile strength at break: 51 MPa

Elongation at break: 2%

Initial tensile elasticity: 3.6 GPa

Thermal Properties

Glass transition temperature: 281° C. (TMA)

5% Weight loss temperature: 522° C. (in the air), 535° C. (in nitrogen)

10% Weight loss temperature: 541° C. (in the air), 554° C. (in nitrogen)

Carbonization yield: 73% (in nitrogen, 800° C.)

Coefficient of thermal expansion: 64 ppm/° C. (150° C. to 200° C.)

Optical Properties

Cut-off wavelength: 341 nm

Light transmittance at 500 nm: 75% d-Line refractive index ($n_d$): 1.630 (in-plane), 1.628 (out-of-plane)

Average refractive index ($n_{ave}$): 1.629

Permittivity ($\varepsilon$): 2.92

Example 14

Synthesis of Polybenzimidazole (PBI (TPBT-PhTA))

[Chem. 44]

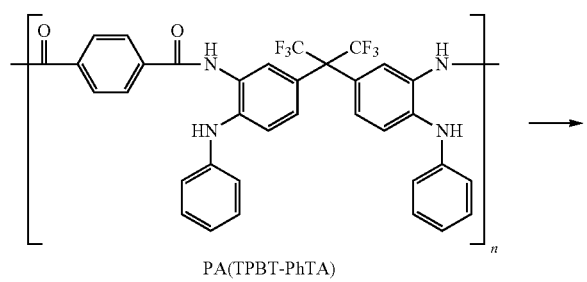

PA(TPBT-PhTA)

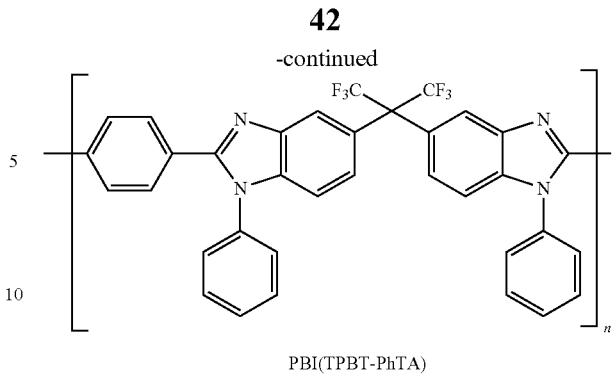

PBI(TPBT-PhTA)

Dry PA (TPBT-PhTA) was dissolved in DMAc to provide a polymer solution at a concentration of 20 wt %. This polymer solution was cast on a glass plate and dried in a desiccator under reduced pressure for six hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 410° C. for 10 minutes. Thereby, a flexible, pale yellow polybenzimidazole film (20 μm) was produced. FT-IR was performed to confirm disappearance of amide bonds, progress of a dehydrocyclization reaction, and generation of a polybenzimidazole. The physical properties of this film were determined. The results are shown below.

FT-IR (film, cm$^{-1}$): 1598 (C=C), 1500 (C=C), 1455 (C=N), 1170 (C—F)

Solubility: 20 wt % dissolved in NMP, DMAc, DMF, THF, and chloroform

Thermal Properties

Glass transition temperature: 366° C. (TMA)

5% Weight loss temperature: 525° C. (in the air), 531° C. (in nitrogen)

10% Weight loss temperature: 542° C. (in the air), 550° C. (in nitrogen)

Carbonization yield: 74% (in nitrogen, 800° C.)

Coefficient of thermal expansion: 69 ppm/° C. (150° C. to 200° C.)

Optical Properties

Cut-off wavelength: 330 nm

Light transmittance at 500 nm: 86% d-Line refractive index ($n_d$): 1.640 (in-plane), 1.638 (out-of-plane)

Average refractive index ($n_{ave}$): 1.639

Permittivity ($\varepsilon$): 2.95

Example 15

Synthesis of Polybenzimidazole (PBI (HPBT-PhTA))

[Chem. 45]

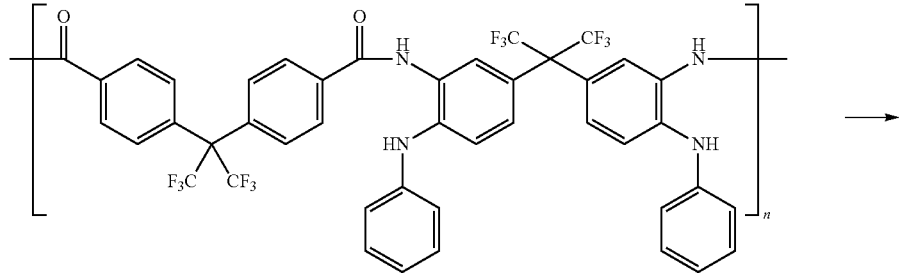

PA(HPBT-PhTA)

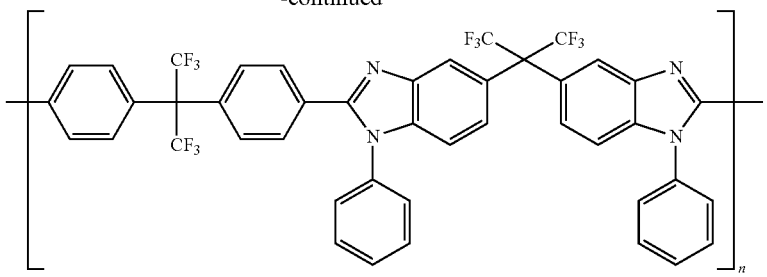

PBI(HPBT-PhTA)

Dry PA (HPBT-PhTA) was dissolved in DMAc to provide a polymer solution at a concentration of 20 wt %. This polymer solution was cast on a quartz plate and dried in a desiccator under reduced pressure for six hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 410° C. for 10 minutes. Thereby, a colorless and transparent polybenzimidazole film (7 μm) was produced. FT-IR and $^1$H-NMR were performed to confirm disappearance of amide bonds, progress of a dehydrocyclization reaction, and generation of a polybenzimidazole. The physical properties of this film are shown below.

FT-IR (film, cm$^{-1}$): 1600 (C=C), 1499 (C=C), 1453 (C=N), 1177 (C—F)

$^1$H-NMR (CDCl3, ppm): 7.18 (d, 2H, Ar—H), 7.27 (d, 2H, Ar—H), 7.31 (d, 4H, Ar—H), 7.35 (d, 4H, Ar—H), 7.53 (t, 2H, Ar—H), 7.55 (t, 4H, Ar—H), 7.59 (d, 4H, Ar—H), 8.10 (s, 2H, Ar—H)

Solubility: 20 wt % dissolved in NMP, DMAc, DMF, THF, chloroform, and acetone

Thermal Properties
Glass transition temperature: 287° C. (DSC)
5% Weight loss temperature: 495° C. (in the air), 502° C. (in nitrogen)
10% Weight loss temperature: 512° C. (in the air), 524° C. (in nitrogen)
Carbonization yield: 59% (in nitrogen, 800° C.)

Optical Properties
Cut-off wavelength: 340 nm
Light transmittance at 500 nm: 78%
d-Line refractive index ($n_d$): 1.580 (in-plane), 1.582 (out-of-plane)
Average refractive index ($n_{ave}$): 1.581
Permittivity (ε): 2.75

Example 16

Synthesis of Polybenzimidazole (PBI (OBBT-TA))

[Chem. 46]

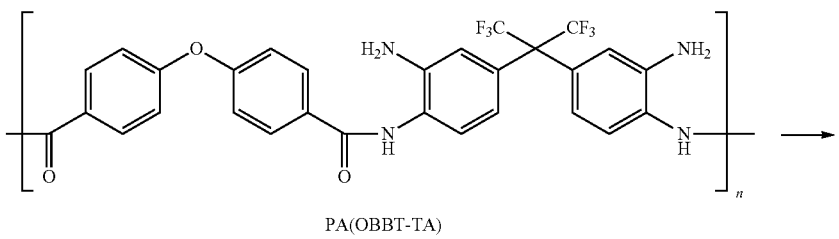

PA(OBBT-TA)

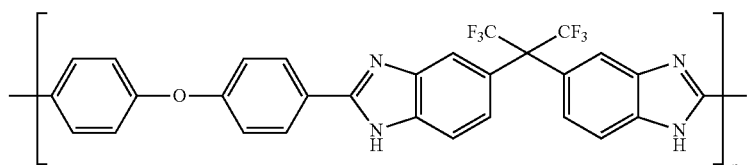

PBI(OBBT-TA)

Dry PA (OBBT-TA) was dissolved in DMAc to provide a polymer solution at a concentration of 20 wt % was prepared. This polymer solution was cast on a glass plate and dried in a desiccator under reduced pressure at room temperature for six hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 410° C. for 10 minutes. Thereby, a colorless and transparent polybenzimidazole film (20 μm) was produced. FT-IR was performed to confirm disappearance of amide bonds, progress of a dehydrocyclization reaction, and generation of a polybenzimidazole. The physical properties of this film are shown below.

FT-IR (film, cm$^{-1}$): 1495 (C=C), 1460 (C=N), 1244 (C—O—C), 1171 (C—F)

Logarithmic viscosity: 0.52 dL/g (NMP solution at a concentration of 0.5 g/dL, measured at 30° C.)

GPC: $M_n$=40000, $M_w$=64000, $M_w/M_n$=1.6

Solubility: 20 wt % dissolved in NMP, DMAc, and DMF

Mechanical Properties
  Tensile strength at break: 80 MPa
  Elongation at break: 2%
  Initial tensile elasticity: 3.3 GPa
Thermal Properties
  Glass transition temperature: 373° C. (TMA)
  5% Weight loss temperature: 484° C. (in the air), 511° C. (in nitrogen)
  10% Weight loss temperature: 514° C. (in the air), 532° C. (in nitrogen)
  Carbonization yield: 66% (in nitrogen, 800° C.)
  Coefficient of thermal expansion: 45 ppm/° C. (150° C. to 200° C.)
Optical Properties
  Cut-off wavelength: 352 m
  Light transmittance at 500 nm: 78%
  d-Line refractive index ($n_d$): 1.657 (in-plane), 1.633 (out-of-plane)
  Average refractive index ($n_{ave}$): 1.641
  Permittivity (ε): 2.96

Example 17

Synthesis of Polybenzimidazole (PBI (OBBT-TA))

[Chem. 47]

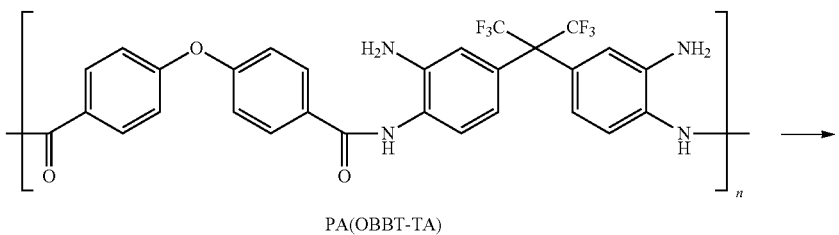

PA(OBBT-TA)

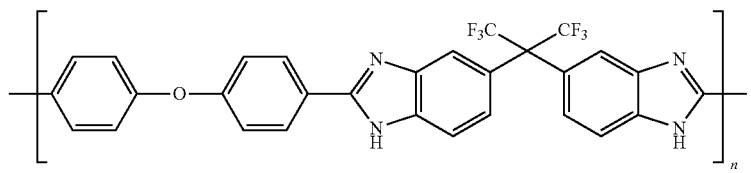

PBI(OBBT-TA)

The polymerization solution obtained in Example 7 was cast as it is on a glass plate and dried in a desiccator under reduced pressure at room temperature for six hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 410° C. for 10 minutes. Thereby, a colorless and transparent polybenzimidazole film (13 μm) was produced. FT-IR was performed to confirm disappearance of amide bonds, progress of a dehydrocyclization reaction, and generation of a polybenzimidazole. The physical properties of this film are shown below.

FT-IR (film, cm$^{-1}$): 1500 (C=C), 1450 (C=N), 1244 (C—O—C), 1171 (C—F)

Optical Properties
  Cut-off wavelength: 351 nm
  Light transmittance at 500 nm: 80%
  d-Line refractive index ($n_d$): 1.630 (in-plane), 1.627 (out-of-plane)
  Average refractive index ($n_{ave}$): 1.628
  Permittivity (ε): 2.92

Example 18

Synthesis of Polybenzimidazole (PBI (IPBT-TA))

[Chem. 48]

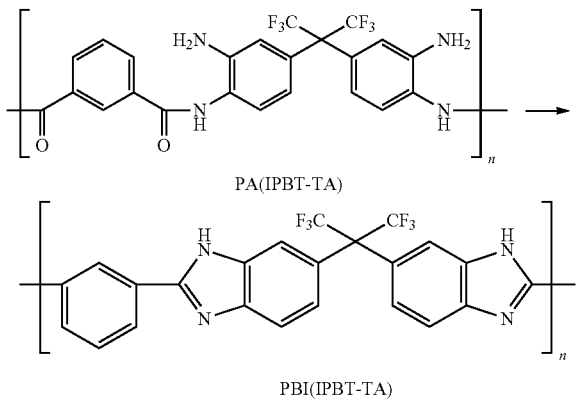

PA(IPBT-TA)

PBI(IPBT-TA)

Dry PA (IPBT-TA) was dissolved in DMAc to provide a polymer solution at a concentration of 20 wt %. This polymer solution was cast on a glass plate and dried in a desiccator under reduced pressure at room temperature for six hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 410° C. for 10 minutes. Thereby, a colorless and transparent polybenzimidazole film (19 μm) was produced. FT-IR was performed to confirm disappearance of amide bonds, progress of a dehydrocyclization reaction, and generation of a polybenzimidazole. The physical properties of this film are shown below.

FT-IR (film, cm$^{-1}$): 1501 (C=C), 1454 (C=N), 1170 (C—F)

Solubility: 20 wt % dissolved in NMP, DMAc, DMF, and DMSO

Logarithmic viscosity: 0.42 dL/g (NMP solution at a concentration of 0.5 g/dL, measured at 30° C.)

GPC: $M_n$=40000, $M_w$=100000, $M_w/M_n$=2.5

Mechanical Properties
  Tensile strength at break: 51 MPa
  Elongation at break: 3%
  Initial tensile elasticity: 2.0 GPa Thermal Properties
  Glass transition temperature: 373° C. (TMA)
  5% Weight loss temperature: 458° C. (in the air), 495° C. (in nitrogen)
  10% Weight loss temperature: 508° C. (in the air), 529° C. (in nitrogen)
  Carbonization yield: 62% (in nitrogen, 800° C.)
  Coefficient of thermal expansion: 36 ppm/° C. (150° C. to 200° C.)

Optical Properties
  Cut-off wavelength: 344 nm
  Light transmittance at 500 nm: 85%
  d-Line refractive index ($n_d$): 1.644 (in-plane), 1.633 (out-of-plane)
  Average refractive index ($n_{ave}$): 1.637
  Permittivity (ε): 2.95

Example 19

Synthesis of Polybenzimidazole (PBI (HPBT-TA))

[Chem. 49]

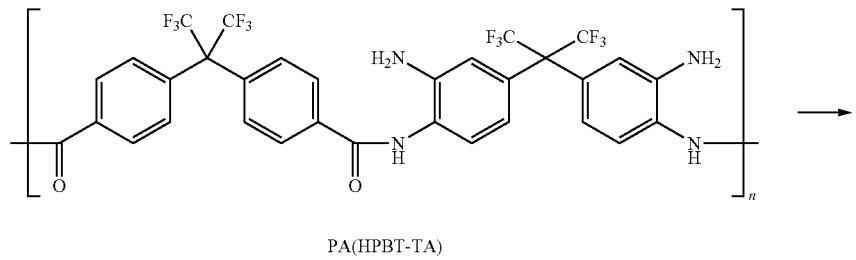

PA(HPBT-TA)

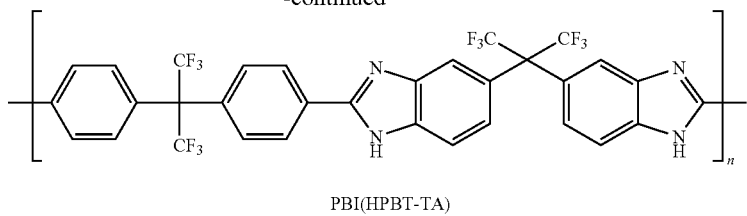

PBI(HPBT-TA)

Dry PA (HPBT-TA) was dissolved in DMAc to provide a polymer solution at a concentration of 20 wt %. This polymer solution was cast on a quartz plate and dried in a desiccator under reduced pressure at room temperature for six hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 410° C. for 10 minutes. Thereby, a colorless and transparent polybenzimidazole film (18 μm) was produced. FT-IR was performed to confirm disappearance of amide bonds, progress of a dehydrocyclization reaction, and generation of a polybenzimidazole. The physical properties of this film are shown below.

FT-IR (KBr, cm$^{-1}$): 1598 (C=C), 1500 (C=C), 1456 (C=N), 1178 (C—F)

Solubility: 20 wt % dissolved in NMP, DMAc, DMF, DMSO, and THF

Thermal Properties
Glass transition temperature: 370° C. (DSC)
5% Weight loss temperature: 495° C. (in the air), 502° C. (in nitrogen)
10% Weight loss temperature: 512° C. (in the air), 524° C. (in nitrogen)
Carbonization yield: 59% (in nitrogen, 800° C.) Optical properties
Cut-off wavelength: 338 nm
Light transmittance at 500 nm: 85%
d-Line refractive index ($n_d$): 1.583 (in-plane), 1.568 (out-of-plane)
Average refractive index ($n_{ave}$): 1.573
Permittivity (ε): 2.72

Comparative Example 4

Synthesis of Polybenzimidazole (PBI (OBBT-DAB))

[Chem. 50]

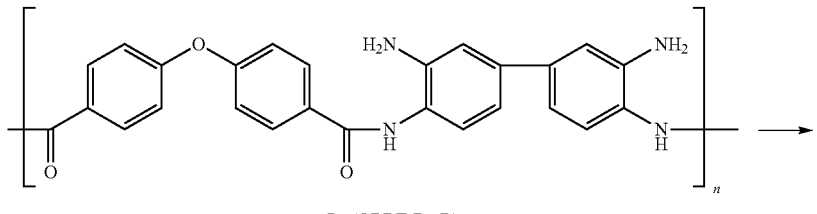

PA(OBBT-DAB)

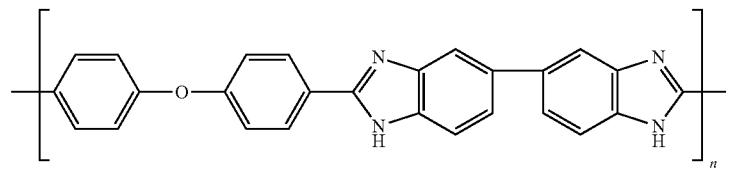

PBI(OBBT-DAB)

Dry PA (OBBT-DAB) was dissolved in DMAc to provide a polymer solution at a concentration of 20 wt %. This polymer solution was cast on a glass plate and dried in a desiccator under reduced pressure for three hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 410° C. for 10 minutes. Thereby, a flexible brown polybenzimidazole film (16 μm) was produced. FT-IR was performed to confirm disappearance of amide bonds, progress of a dehydrocyclization reaction, and generation of a polybenzimidazole. The thermal properties and optical properties of this film are shown below.

FT-IR (film, cm$^{-1}$): 1500 (C=C), 1444 (C=N), 1286 (C—O—C)

GPC: $M_n$=44000, $M_w$=92000, $M_w/M_n$=2.1

Solubility: 20 wt % dissolved in NMP and partially dissolved in DMAc, DMF, and DMSO Thermal Properties Glass transition temperature: 359° C. (TMA)

5% Weight loss temperature: 510° C. (in the air), 536° C. (in nitrogen)

10% Weight loss temperature: 538° C. (in the air), 565° C. (in nitrogen)

Carbonization yield: 73% (in nitrogen, 800° C.)

Coefficient of thermal expansion: 28 ppm/° C. (150° C. to 200° C.)

Optical Properties

Cut-off wavelength: 400 nm

Light transmittance at 500 nm: 39% d-Line refractive index ($n_d$): 1.825 (in-plane), 1.735 (out-of-plane)

Average refractive index ($n_{ave}$): 1.765

Permittivity (ε): 3.43

Comparative Example 5

Synthesis of Polybenzimidazole (PBI (IPBT-DAB))

[Chem. 51]

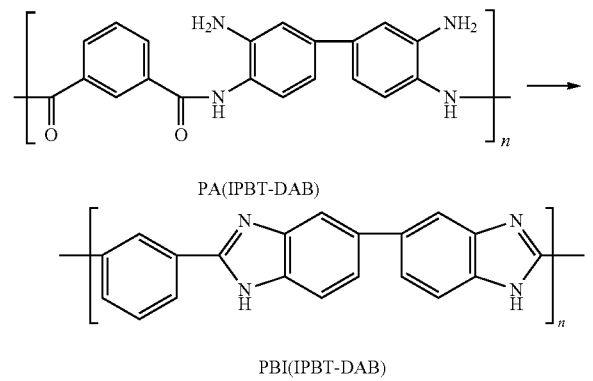

Dry PA (IPBT-DAB) was dissolved in DMAc to provide a polymer solution at a concentration of 20 wt %. This polymer solution was cast on a glass plate and dried in a desiccator under reduced pressure at room temperature for six hours. The workpiece was subjected to heat treatment in a vacuum oven at 60° C. for six hours, at 100° C. for six hours, at 150° C. for one hour, at 200° C. for one hour, at 250° C. for one hour, at 300° C. for one hour, at 350° C. for one hour, and at 410° C. for 10 minutes. Thereby, a flexible brown polybenzimidazole film (17 μm) was produced. FT-IR was performed to confirm disappearance of amide bonds, progress of a dehydrocyclization reaction, and generation of a polybenzimidazole. The thermal properties and optical properties of this film are shown below.

FT-IR (film, cm$^{-1}$): 1498 (C=C), 1444 (C=N)

Solubility: partially dissolved in NMP, DMAc, DMF, and DMSO

Thermal Properties

Glass transition temperature: 411° C. (TMA)

5% Weight loss temperature: 504° C. (in the air), 627° C. (in nitrogen)

10% Weight loss temperature: 531° C. (in the air), 704° C. (in nitrogen)

Carbonization yield: 82% (in nitrogen, 800° C.)

Coefficient of thermal expansion: 21 ppm/° C. (150° C. to 200° C.)

Optical Properties

Cut-off wavelength: 401 nm

Light transmittance at 500 nm: 61% d-Line refractive index ($n_d$): 1.851 (in-plane), 1.695 (out-of-plane)

Average refractive index ($n_{ave}$): 1.747

Permittivity (ε): 3.36

As described above, the polybenzimidazoles of the respective examples exhibited high solubility in solvents such as NMP and DMAc. The polybenzimidazole films each had a cut-off wavelength of 330 to 352 nm, which indicates excellent transparency. The refractive indexes thereof were 1.573 to 1.641 and the permittivities thereof were as low as 2.72 to 2.96.

INDUSTRIAL APPLICABILITY

The polybenzimidazole of the invention has excellent heat resistance as well as excellent solubility in solvents, electric insulation, colorless transparency, and flexibility. Thus, the polybenzimidazole can suitably be used for applications such as films, polymer electrolyte membranes, and resist materials.

The invention claimed is:

1. A polybenzimidazole production method for producing the polybenzimidazole comprising a repeating unit represented by the formula (1), the method comprising:

a step (1-1) of polymerizing a tetramine compound (3) represented by the following formula (3) and a dicarboxylic acid derivative compound (4) represented by the following formula (4) to provide a polybenzimidazole precursor polyamide containing a repeating unit represented by the following formula (2); and a step (1-2) of dehydrocyclizing the polybenzimidazole precursor polyamide to provide the polybenzimidazole containing a repeating unit represented by the formula (1), the formula (1) being as follows:

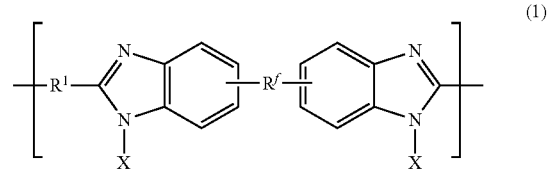

wherein

R$^f$ is —SO$_2$—, —O—, —CO—, an alkylene group optionally containing a substituent, or a group represented by the following formula:

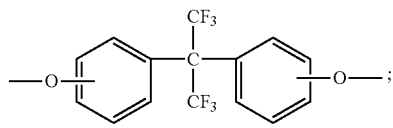

the formula (2) being as follows:

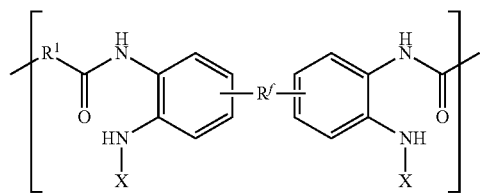

(2)

wherein

R$^f$ is —SO$_2$—, —O—, —CO—, an alkylene group optionally containing a substituent, or a group represented by the following formula:

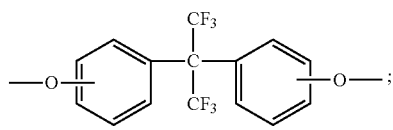

two Xs are each individually a hydrogen atom or a monovalent organic group; and

R$^1$ is a divalent organic group, the formula (3) being as follows:

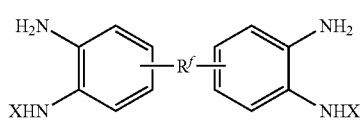

(3)

wherein

R$^f$ is —SO$_2$—, —O—, —CO—, an alkylene group optionally containing a substituent, or a group represented by the following formula:

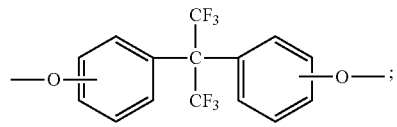

and two Xs are each individually a hydrogen atom or a monovalent organic group, the formula (4) being as follows:

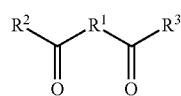

(4)

wherein

R$^1$ is a divalent organic group; and

R$^2$ and R$^3$ are each individually an aromatic oxy group optionally containing a substituent.

2. The production method according to claim 1, wherein R$^f$ is a fluorine-substituted alkylene group.

3. The production method according to claim 1, wherein R$^f$ is —C(CF$_3$)$_2$—.

* * * * *